US009093665B2

(12) United States Patent
Ikeda

(10) Patent No.: US 9,093,665 B2
(45) Date of Patent: Jul. 28, 2015

(54) LIGHT-EMITTING MODULE AND METHOD FOR MANUFACTURING THE SAME

(71) Applicant: Hisao Ikeda, Kanagawa (JP)

(72) Inventor: Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 30 days.

(21) Appl. No.: 13/653,710

(22) Filed: Oct. 17, 2012

(65) Prior Publication Data

US 2013/0099210 A1      Apr. 25, 2013

(30) Foreign Application Priority Data

Oct. 19, 2011   (JP) ................. 2011-229901

(51) Int. Cl.
*H01L 33/00*    (2010.01)
*H01L 51/52*    (2006.01)

(52) U.S. Cl.
CPC ..... *H01L 51/5271* (2013.01); *H01L 2251/5369* (2013.01)

(58) Field of Classification Search
CPC .................................................. H01L 51/5271
USPC ............................................ 257/98, E51.021
See application file for complete search history.

(56) References Cited

U.S. PATENT DOCUMENTS

| 6,433,487 | B1  | 8/2002  | Yamazaki |
| 6,717,641 | B2  | 4/2004  | Arai |
| 6,833,667 | B2  | 12/2004 | Hamano et al. |
| 6,847,163 | B1  | 1/2005  | Tsutsui et al. |
| 7,223,146 | B2  | 5/2007  | Nishikawa |
| 7,922,358 | B2* | 4/2011  | von Malm ..................... 362/293 |
| 2004/0119400 | A1 | 6/2004 | Takahashi et al. |
| 2004/0196420 | A1* | 10/2004 | Wu et al. ...................... 349/114 |
| 2006/0158109 | A1 | 7/2006 | Takahashi et al. |
| 2011/0050082 | A1 | 3/2011 | Inoue et al. |
| 2012/0161115 | A1 | 6/2012 | Yamazaki et al. |
| 2012/0176563 | A1 | 7/2012 | Adachi et al. |
| 2013/0099210 | A1* | 4/2013 | Ikeda .............................. 257/40 |

FOREIGN PATENT DOCUMENTS

| JP | 2001-201740    | 7/2001  |
| JP | 2004-14385     | 1/2004  |
| JP | 2012-145628    | 8/2012  |
| WO | WO 02/080626   | 10/2002 |

* cited by examiner

*Primary Examiner* — Mark Prenty
(74) *Attorney, Agent, or Firm* — Husch Blackwell LLP

(57) ABSTRACT

A light-emitting module with improved light extraction efficiency and reliability is provided. In the light-emitting module, an element substrate with gas barrier properties is used; a light-emitting element is optically connected to one surface side of the element substrate; and a diffuse reflection layer is in contact with the other surface side of the element substrate. The diffuse reflection layer has a diffuse reflectance of greater than or equal to 75% and less than 100%. The light-emitting element includes a layer containing a light-emitting organic compound between a pair of light-transmitting electrodes. The element substrate transmits light emitted from the light-emitting element; the refractive index of the element substrate is different from that of layer containing a light-emitting organic compound by 0.2 or less.

15 Claims, 7 Drawing Sheets

LIGHT-EMITTING MODULE AND METHOD FOR MANUFACTURING THE SAME

BACKGROUND OF THE INVENTION

1. Field of the Invention

The present invention relates to a light-emitting module provided with a light-emitting element in a sealed space, and a method for manufacturing the light-emitting module.

2. Description of the Related Art

A light-emitting element, in which a layer containing a light-emitting compound formed in a film shape is provided between a pair of electrodes, is known. Examples of such a light-emitting element include an organic EL element (also referred to as an organic electroluminescence element) and an inorganic EL element. In the organic EL element, light emission can be obtained from a layer containing a light-emitting organic compound when voltage is applied between a pair of electrodes. In recent years, research and development have been extensively conducted on light-emitting devices (specifically, lighting devices and display devices) including organic EL elements.

In an organic EL element, light is emitted from a layer containing a light-emitting organic compound. The layer containing a light-emitting organic compound has a higher refractive index than the air. Light emitted from the layer having a higher refractive index than the air is difficult to extract to the air; thus, special contrivance is needed so as to efficiently extract the light from the organic EL element to the air.

For example, an organic electroluminescence element disclosed in Patent Document 1 is an organic electroluminescence device in which a back electrode, an organic electroluminescence light-emitting layer, and a light-transmitting front electrode are stacked in this order. In the organic electroluminescence element, the back electrode is a light-transmitting electrode, and a light-scattering layer having a high refractive index, which includes a material having a refractive index of 80% or more of that of the organic electroluminescence light-emitting layer as its main component, is provided on a back side of the back electrode. Further, the refractive index of a layer provided between the light-emitting layer and the light-scattering layer having a high refractive index is adjusted so that 40% or more of light emitted from the light-emitting layer to the back side enters the light-scattering layer having a high refractive index.

A dispersion electroluminescence element disclosed in patent document 2 is provided with a light-scattering back-face sheet. With such a structure, extraction efficiency of light to the outside is enhanced. Note that the dispersion electroluminescence element is one mode of an inorganic EL element.

The reliability of an organic EL element tends to decrease in the environment where there are impurities (such as water and/or oxygen) in the air. A variety of structures for sealing the organic EL element have been developed. For example, a sealing structure in which an organic EL element formed over a substrate with low moisture permeability is covered with a sealing film with low moisture permeability is known.

REFERENCE

Patent Document

[Patent Document 1] Japanese Published Patent Application No. 2004-014385
[Patent Document 2] PCT International Publication No. 2002/080626

SUMMARY OF THE INVENTION

In the organic electroluminescence element disclosed in Patent Document 1, reliability of the organic electroluminescence element may be decreased because of diffusion of impurities from the layer provided between the light-transmitting back electrode and the light-scattering layer having a high refractive index to the organic electroluminescence light-emitting layer.

One embodiment of the present invention is made in view of the foregoing technical background. Thus, an object of the present invention is to provide a light-emitting module in which light extraction efficiency and reliability are improved. Further, an object of the present invention is to provide a method for manufacturing a light-emitting module with improved light extraction efficiency and reliability.

In order to achieve any of the above objects, one embodiment of the present invention focuses on a layer provided between a light-emitting element and a diffuse reflection layer. Further, one embodiment of the present invention has arrived at an idea of a light-emitting module having a structure described below, which solves the above problems.

A light-emitting module according to one embodiment of the present invention has a structure in which an element substrate with gas barrier properties is used, a light-emitting element is optically connected to one surface side of the element substrate and a diffuse reflection layer is provided for the other surface side of the element substrate. Note that the diffuse reflectance of the diffuse reflection layer is greater than or equal to 75% and less than 100%. The light-emitting element includes a layer containing a light-emitting organic compound between a pair of light-transmitting electrodes. The element substrate transmits light emitted from the light-emitting element; the refractive index of the element substrate is different from that of the layer containing a light-emitting organic compound by 0.2 or less; and the formation temperature of the element substrate is higher than both the formation temperature of the light-emitting element and that of the diffuse reflection layer.

That is, one embodiment of the present invention is a light-emitting module including an element substrate with gas barrier properties; a light-emitting element including a first electrode optically connected to one surface of the element substrate; a sealing material which seals the light-emitting element between the one surface of the element substrate and the sealing material; and a diffuse reflection layer on the other surface of the element substrate. The diffuse reflection layer has a diffuse reflectance of greater than or equal to 75% and less than 100%. The light-emitting element includes the first electrode, a second electrode overlapping with the first electrode, and a layer containing a light-emitting organic compound between the first electrode and the second electrode. The first electrode and the second electrode both transmit light emitted from the layer containing a light-emitting organic compound. The sealing material has a region which transmits the light emitted from the layer containing a light-emitting organic compound and which overlaps with the light-emitting element. The element substrate transmits light emitted from the layer containing a light-emitting organic compound; the refractive index of the element substrate is different from that of the layer containing a light-emitting organic compound by 0.2 or less; and at least one surface of the element substrate is provided with a glass layer formed at a temperature higher than both the formation temperature of the light-emitting element and that of the diffuse reflection layer.

The light-emitting module according to one embodiment of the present invention has a structure in which an element substrate with gas barrier properties is used, a light-emitting element is optically connected to one surface side of the element substrate, and a diffuse reflection layer is provided for the other surface side of the element substrate. Here, the refractive index of the element substrate between the light-emitting element and the diffuse reflection layer is different from that of the layer containing a light-emitting organic compound by 0.2 or less; thus, part of light emitted from the layer containing a light-emitting organic compound, which travels to the diffuse reflection layer from the first electrode side, can reaches the diffuse reflection layer efficiently. Incident light is diffusely reflected by the diffuse reflection layer (the incident light is reflected at various angles including an angle that is different from the angle of incidence); thus, a waveguide is not easily formed between the diffuse reflection layer and the light-emitting element. Accordingly, a light-emitting module with improved extraction efficiency is provided. In addition, at least one surface of the element substrate is provided with a glass layer formed at a temperature higher than both the formation temperature of the light-emitting element and that of the diffuse reflection layer; thus, diffusion of impurities into the light-emitting element optically connected to the one surface of the element substrate can be suppressed. As a result, a light-emitting module with high reliability can be provided.

Further, one embodiment of the present invention is the light-emitting module, in which the one surface of the element substrate is glass having a flat surface and the first electrode is optically connected to the flat surface.

The light-emitting module according to one embodiment of the present invention has a structure in which the one surface of the element substrate with gas barrier properties is glass having a flat surface, the first electrode of the light-emitting element is provided over the flat surface side, and the diffuse reflection layer is provided over the other surface side. Accordingly, a flat surface of the first electrode can be easily formed, and the first electrode and the second electrode are hardly short-circuited. Thus, a light-emitting module with improved light extraction efficiency and high reliability can be provided.

One embodiment of the present invention is the light-emitting module, in which the glass is oxide glass formed at a temperature higher than or equal to 300° C. and lower than or equal to 1700° C. and containing silicon and a metal selected from lead, zinc, barium, titanium, and lanthanum.

In the light-emitting module according to one embodiment of the present invention, at least the one surface of the element substrate is provided with oxide glass formed at a temperature higher than or equal to 300° C. and lower than or equal to 1700° C. and containing silicon and a metal selected from lead, zinc, barium, titanium, and lanthanum. Here, the oxide glass containing silicon is subjected to heat treatment at a temperature higher than or equal to 300° C. and lower than or equal to 1700° C.; thus, free volume is reduced with a dense structure and diffusion of impurities is suppressed. As a result, a light-emitting module with high reliability can be provided. The oxide glass containing silicon further contains a metal selected from lead, zinc, barium, titanium, and lanthanum, whereby the difference between the refractive indices of the oxide glass and the layer containing a light-emitting organic compound is 0.2 or less. Thus, a light-emitting module with improved light extraction efficiency can be provided.

One embodiment of the present invention is the light-emitting module, in which the element substrate has a thickness of greater than or equal to 50 μm and less than or equal to 1000 μm.

The light-emitting module according to one embodiment of the present invention includes the light-emitting substrate having a thickness of greater than or equal to 50 μm and less than or equal to 1000 μm. Light emitted from the light-emitting element to the element substrate side enters the element substrate at various angles and spreads toward the diffuse reflection layer. The light expands in a wide range as the distance between the light-emitting element and the diffuse reflection layer is longer, that is, as the element substrate is thicker. Further, the light that has reached the diffuse reflection layer is diffusely reflected at various angles by the diffuse reflection layer, and spreads to the light-emitting element side of the element substrate.

When another light-emitting element is provided in a range where light emitted from one light-emitting element is diffusely reflected back by the diffuse reflection layer, light emitted from each light-emitting layer is mixed; thus, light emitted from a plurality of light-emitting elements provided adjacently is averaged.

With this structure, even when one of the plurality of light-emitting elements emits light abnormally (specifically, the luminance of the light-emitting element is darker or brighter than that of the other light-emitting elements), the abnormal light emission can be averaged and less visible. Specifically, when the element substrate has a thickness of greater than or equal to 50 μm, light emitted from the plurality of light-emitting elements can be averaged and abnormal light emission can be less visible. The same effect can be obtained in the case where a part of the layer containing a light-emitting organic compound provided in a planar manner or in a linear manner has brighter luminance or darker luminance than the other parts.

Further, as the distance between the light-emitting element and the diffuse reflection layer is longer, that is, as the element substrate is thicker, light emitted from the light-emitting element to the element substrate side is spread out in a wider range. In the case where the element substrate is too thick, the light may be leaked from the edge portion of the substrate. The element substrate preferably has a thickness of less than or equal to 1000 μm. Accordingly, a light-emitting module with improved light extraction efficiency and high reliability can be provided.

One embodiment of the present invention is the light-emitting module, in which the diffuse reflection layer includes a particle having a median particle diameter of greater than or equal to 1 μm and less than or equal to 100 μm in a base material so as to have a transmittance of less than 25% to the light emitted from the light-emitting element, the refractive index of the base material is different from that of the element substrate by 0.2 or less or higher than that of the element substrate, and a difference between the refractive indices of the particle and the base material is 0.3 or more.

In the light-emitting module according to one embodiment of the present invention, the diffuse reflection layer including a base material having a refractive index that is substantially the same as or higher than that of the element substrate and a particle having a refractive index that is different from that of the base material by 0.3 or more, is provided on the other surface of the element substrate. With this structure, light which enters the diffuse reflection layer from the light-emitting element through the element substrate is reflected diffusely to the side of the element substrate on which the light-emitting element is provided. Accordingly, a light-emitting module with improved light extraction efficiency and high reliability can be provided.

One embodiment of the present invention is the light-emitting module, in which the diffuse reflection layer includes a particle having a median particle diameter of greater than or equal to 1 μm and less than or equal to 100 μm in a base material so as to have a transmittance of less than 25% to the light emitted from the light-emitting element, the refractive index of the particle is different from that of the element substrate by 0.2 or less or higher than that of the element substrate, and a difference between the refractive indices of the particle and the base material is 0.3 or more.

In the light-emitting module according to one embodiment of the present invention, the diffuse reflection layer including a particle having a refractive index that is substantially the same as or higher than that of the element substrate and a base material having a refractive index that is different from that of the particle by 0.3 or more, is provided on the other surface of the element substrate. With this structure, light which enters the diffuse reflection layer from the light-emitting element through the element substrate is reflected diffusely by the diffuse reflection layer to the side of the element substrate on which the light-emitting element is provided. Accordingly, a light-emitting module with improved light extraction efficiency and high reliability can be provided.

In the light-emitting module according to one embodiment of the present invention, a connection layer having a refractive index that is different from that of the element substrate by 0.2 or less may be formed between the other surface of the element substrate and one surface of the diffuse reflection layer; unevenness is formed on the other surface of diffuse reflection layer; and a reflection layer is provided along the unevenness.

The light-emitting module according to one embodiment of the present invention is provided with a layer for connecting the other surface of the element substrate and the diffuse reflection layer. With this structure, the light which is emitted from the light-emitting element and enters one surface of the diffuse reflection layer through the element substrate is reflected diffusely by the diffuse reflection layer. Thus, a light-emitting module with improved light extraction efficiency and high reliability can be provided.

One embodiment of the present invention is a method for manufacturing a light-emitting module including first to third steps of forming a light-emitting element including a layer containing a light-emitting organic compound between a first electrode and a second electrode overlapping with the first electrode, the first electrode being optically connected one surface of an element substrate with gas properties; sealing the light-emitting element between the one surface of the element substrate and a sealing material; and forming a diffuse reflection layer on the other surface of the element substrate. In this structure, the first electrode and the second electrode both transmit light emitted from the layer containing a light-emitting organic compound.

In the method for manufacturing a light-emitting module according to one embodiment of the present invention, the light-emitting element is provided on the one surface of the element substrate, and then sealed by a sealing material, and the diffuse reflection layer is formed on the other surface of the element substrate (that is, the surface opposite to the surface on which the light-emitting element is sealed). Accordingly, a light-emitting module with improved light extraction efficiency and reliability can be provided.

The formation of the light-emitting element usually requires an extremely clean environment so as to prevent a decrease in reliability due to mixture of impurities. However, in the method for manufacturing a light-emitting module according to one embodiment of the present invention, the light-emitting element is sealed after the formation of the light-emitting element and before the formation of the diffuse reflection layer. Thus, the diffuse reflection layer can be formed also in an environment which is not as clean as the environment for forming the light-emitting element. Thus, a light-emitting module with improved light extraction efficiency and high reliability can be provided using simple manufacturing facilities.

Note that in this specification, an "EL layer" refers to a layer provided between a pair of electrodes in a light-emitting element. Thus, a light-emitting layer containing an organic compound that is a light-emitting substance which is provided between electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

According to one embodiment of the present invention, a light-emitting module with improved light extraction efficiency and reliability can be provided. Further, a method for manufacturing the light-emitting module with improved light extraction efficiency and reliability can be provided.

BRIEF DESCRIPTION OF THE DRAWINGS

FIGS. 2A to 2E each illustrate a diffuse reflection layer of a light-emitting module according to one embodiment.

DETAILED DESCRIPTION OF THE INVENTION

Figure 1A:
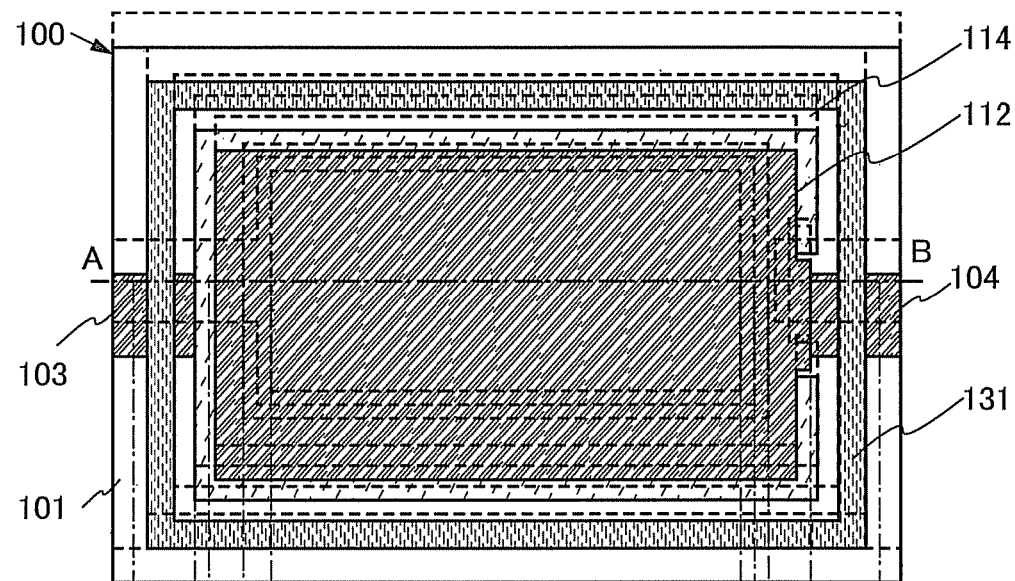
FIGS. 1A to 1C each illustrate a light-emitting module according to one embodiment.

Embodiments will be described with reference to drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a structure of a light-emitting module according to one embodiment of the present invention is described. Specifically, the light-emitting module has the following structure: an element substrate with gas barrier properties is used; a light-emitting element is optically connected to one surface side of the element substrate; and a diffuse reflection layer is provided for the other surface side of the element substrate. Note that the diffuse reflectance of the diffuse reflection layer is greater than or equal to 75% and less than 100%. Further, the light-emitting element includes a layer containing a light-emitting organic compound between a pair of light-transmitting electrodes. The element substrate transmits light emitted from the light-emitting element; the refractive index of the element substrate is different from that of the layer containing a light-emitting organic compound by 0.2 or less; and the formation temperature of the element substrate is higher than both the formation temperature of the light-emitting element and that of the diffuse reflection layer.

The light-emitting module according to one embodiment of the present invention has a structure in which an element substrate with gas barrier properties is used, a light-emitting element is optically connected to one surface side of the element substrate, and a diffuse reflection layer is provided for the other surface side of the element substrate. Here, the refractive index of the element substrate between the light-emitting element and the diffuse reflection layer is different from that of the layer containing a light-emitting organic compound by 0.2 or less; thus, part of light emitted from the layer containing a light-emitting organic compound, which travels to the diffuse reflection layer from the first electrode side, can reaches the diffuse reflection layer efficiently. Incident light is diffusely reflected by the diffuse reflection layer (the incident light is reflected at various angles including an angle that is different from the angle of incidence); thus, a waveguide is not easily formed between the diffuse reflection layer and the light-emitting element. Accordingly, a light-emitting module with improved extraction efficiency is provided. In addition, at least one surface of the element substrate is provided with a glass layer formed at a temperature higher than both the formation temperature of the light-emitting element and that of the diffuse reflection layer; thus, diffusion of impurities into the light-emitting element optically connected to the one surface of the element substrate can be suppressed. As a result, a light-emitting module with high reliability can be provided.

A light-emitting module according to one embodiment of the present invention, which has the above described structure, is described with reference to FIGS. 1A to 1C, FIGS. 2A to 2E, and FIGS. 3A and 3B.

Figure 1B:
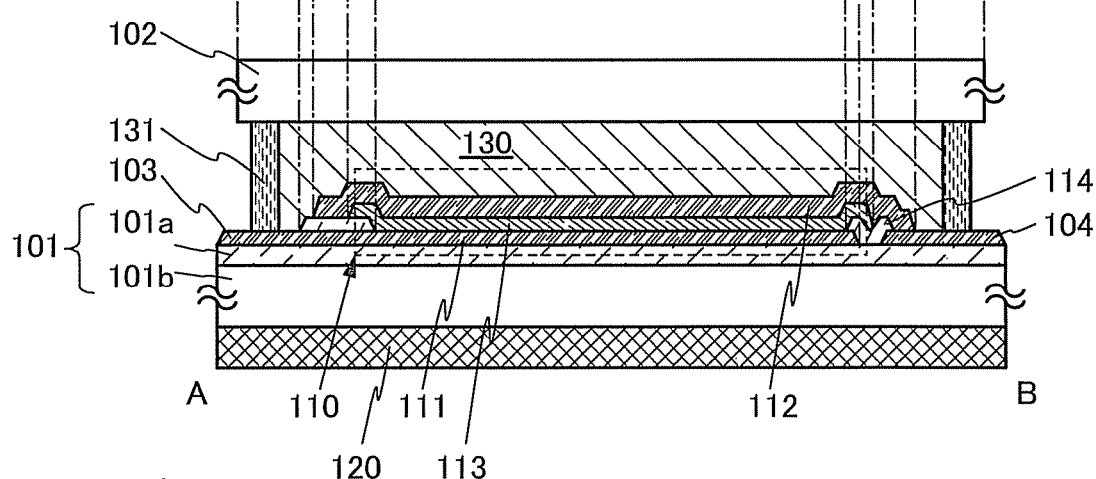

FIGS. 1A and 1B illustrate a structure of the light-emitting module according to one embodiment of the present invention. FIG. 1A is a top view of the light-emitting module according to one embodiment of the present invention, and FIG. 1B is a cross-sectional view taken along line A-B in FIG. 1A. The light-emitting module in FIGS. 1A to 1C includes an element substrate 101 with gas barrier properties, a light-emitting element 110, a sealing material including a sealing substrate 102 and a sealant 131, and a diffuse reflection layer 120. Further, the light-emitting element 110 includes a first electrode 111 optically connected to one surface of the element substrate 101, and is sealed between the one surface of the element substrate 101 and the sealing material.

⟨Light-Emitting Element⟩

The light-emitting element 110 includes the first electrode 111, a second electrode 112 overlapping with the first electrode 111, and a layer 113 containing a light-emitting organic compound between the first electrode 111 and the second electrode 112. The first electrode 111 and the second electrode 112 both transmit light emitted from the layer 113 containing a light-emitting organic compound. Further, the first electrode 111 is electrically connected to a first terminal 103 which extends outside the sealing material, and the second electrode 112 is electrically connected to a second terminal 104 which extends outside the sealing material.

A material which has conductivity and transmits light emitted from the layer 113 containing a light-emitting organic compound can be used as a material for the first electrode 111 and the second electrode 112 of the light-emitting element 110 according to one embodiment of the present invention. Specifically, a layer formed using a metal oxide, an electrically conductive compound, a metal or an alloy, or a mixture or a stack thereof, which partly transmits light with a wavelength greater than or equal to 400 nm and less than 800 nm can be used.

As the metal oxide which partly transmits light with a wavelength greater than or equal to 400 nm and less than 800 nm, indium tin oxide (ITO), indium tin oxide containing silicon or silicon oxide, indium zinc oxide containing silicon or silicon oxide, indium zinc oxide containing tungsten, or the like can be used.

As the electrically conductive compound which partly transmits light with a wavelength greater than or equal to 400 nm and less than 800 nm, a conductive polymer such, as poly(3,4-ethylenedioxythiophene)/poly(styrenesulfonic acid) (PEDOT/PSS) or polyaniline/poly(styrenesulfonic acid) (PAni/PSS), or the like can be used.

As the metal layer having such a thickness as to partly transmit light with a wavelength greater than or equal to 400 nm and less than 800 nm, a layer of aluminum, silver, gold, platinum, copper, or the like with a thickness of greater than or equal to 0.1 nm and less than 100 nm can be used. Further, as the alloy layer having a thickness which partly transmits light with a wavelength greater than or equal to 400 nm and less than 800 nm, an alloy containing aluminum (e.g., an aluminum-nickel-lanthanum alloy, an aluminum-titanium alloy, or an aluminum-neodymium alloy), an alloy containing silver (e.g., a silver-neodymium alloy or a magnesium-silver alloy), or the like can be used.

A structure of a light-emitting element used for the light-emitting module according to one embodiment of the present invention will be described in detail in Embodiment 4.

⟨Element Substrate⟩

The element substrate 101 transmits light emitted from the layer 113 containing a light-emitting organic compound, and has a refractive index that is different from that of the layer 113 containing a light-emitting organic compound by 0.2 or less. When the element substrate 101 has a refractive index with such a range, light emitted from the layer 113 containing a light-emitting organic compound can enter the element substrate 101 efficiently.

The element substrate 101 is provided with at least a layer containing glass, and the glass layer is formed at a temperature higher than both the formation temperature of the light-emitting element 110 and that of the diffuse reflection layer 120. The element substrate 101 may be formed by bonding another structure body after the formation of the layer containing glass, and the element substrate 101 may have a single-layer structure of the layer containing glass or a stacked structure of two or more layers.

For example, an extremely thin glass plate (e.g., a glass plate with a thickness of approximately 30 μm to 300 μm formed by a downdraw method or the like), which can keep the shape by itself, can be used for the layer containing glass. Alternatively, the element substrate may be formed, for example, by bonding this extremely thin glass plate to a plastic film or the like in a manufacturing device.

There is no particular limitation on the thickness of the element substrate 101. When the element substrate 101 has a stacked structure of two or more layers, it is preferable that not only the stacked layers each have a refractive index that is different from that of the layer 113 containing a light-emitting organic compound by 0.2 or less but also a difference between the refractive indices of the stacked layers is 0.2 or less. In this embodiment, a structure in which a glass layer 101a and a base material 101b are bonded to each other is described as an example.

The glass layer 101a that is Banned at a temperature higher than both the formation temperature of the light-emitting element 110 and that of the diffuse reflection layer 120 is provided for at least one surface (that is, a surface on a side provided with the light-emitting element 110) of the element substrate 101. In the glass layer 101a formed at a temperature higher than both the formation temperature of the light-emitting element 110 and that of the diffuse reflection layer 120, the concentration of impurities which decrease the reliability of the light-emitting element 110 is reduced. Thus, diffusion of impurities into the light-emitting element optically connected to the one surface of the element substrate can be suppressed.

There is no particular limitation on the kind of glass applicable to the element substrate 101, and for example, non-alkali glass, soda-lime glass, alkali glass, or crystal glass can be used.

When the element substrate 101 has a stacked structure of two or more layers, a plastic material, fiber reinforced plastic (FRP), a prepreg, or the like can be used for a material applicable to the base material 101b. With the stacked structure of two or more layers, shock resistance of the light-emitting module can be improved.

As the material applicable to the element substrate 101, a material which transmits light emitted from the layer 113 containing a light-emitting organic compound and has a refractive index that is different from that of the layer 113 containing a light-emitting organic compound by 0.2 or less can be used. For example, when the refractive index of the layer 113 containing a light-emitting organic compound is 1.7, a material having a refractive index of higher than or equal to 1.5 and lower than or equal to 1.9 is used for the element substrate 101.

《 Modification Example 1 of Element Substrate》

Note that it is preferable that one surface of the element substrate is glass having a flat surface, and the first electrode is optically connected to the flat surface. A reason for this is as follows.

A layer in which particles are dispersed in a base material, for example, can be used for the diffuse reflection layer, a structure of which will be described in detail later. The dispersed particles are likely to generate unevenness on the surface of the diffuse reflection layer having such a structure. If the first electrode of the light-emitting element is formed on the surface with unevenness, the unevenness may be reflected on the surface of the first electrode and the first electrode and the second electrode of the light-emitting element may be short-circuited.

As a method for planarizing unevenness of a film to be a base, a method for depositing a flat film by a dry method or a wet method is given as an example. However, if the film to be a base has large unevenness, it is necessary for the flat film to be Mimed thick and productivity may be decreased in the case of using a dry method or a wet method.

A modification example 1 of the element substrate described in this embodiment is an element substrate one surface of which is glass having a flat surface. That is, the glass having a flat surface is not deposited on the diffuse reflection layer by a dry method or a wet method. Thus, the surface of the element substrate is not affected by the unevenness which occurs on the surface of the diffuse reflection layer. With the structure in which the first electrode of the light-emitting element is optically connected to the flat glass surface side, the first electrode having a flat surface can be easily formed and the first electrode and the second electrode of the light-emitting element are hardly short-circuited. Accordingly, a light-emitting module with improved light extraction efficiency and high reliability can be provided.

《 Modification Example 2 of Element Substrate》

It is preferable that at least one surface of the element substrate is provided with oxide glass formed at a temperature higher than or equal to 300° C. and lower than or equal to 1700° C. and containing silicon and a metal selected from lead, zinc, barium, titanium, and lanthanum. Here, the oxide glass containing silicon is subjected to heat treatment at a temperature higher than or equal to 300° C. and lower than or equal to 1700° C.; thus, free volume is reduced with a dense structure and diffusion of impurities is suppressed. For example, the oxide glass containing silicon with a density of 2.4 g/cm$^3$ or more has an effect of preventing diffusion of impurities; in particular, the oxide glass containing silicon preferably has a density of 2.5 g/cm$^3$ or more. As a result, a light-emitting module with high reliability can be provided. By containing a metal selected from lead, zinc, barium, titanium, and lanthanum, the oxide glass containing silicon has a refractive index that is different from that of the layer containing a light-emitting organic compound by 0.2 or less. As a result, a light-emitting module with improved light extraction efficiency can be provided.

《 Modification Example 3 of Element Substrate》

The element substrate preferably has a thickness of greater than or equal to 50 μm and less than or equal to 1000 Light emitted from the light-emitting element to the element substrate side enters the element substrate at various angles and spreads toward the diffuse reflection layer. The light expands in a wide range as the distance between the light-emitting element and the diffuse reflection layer is longer, that is, as the element substrate is thicker. Further, the light that has reached the diffuse reflection layer is diffusely reflected at various angles by the diffuse reflection layer, and spreads to the light-emitting element side of the element substrate.

Figure 3A:
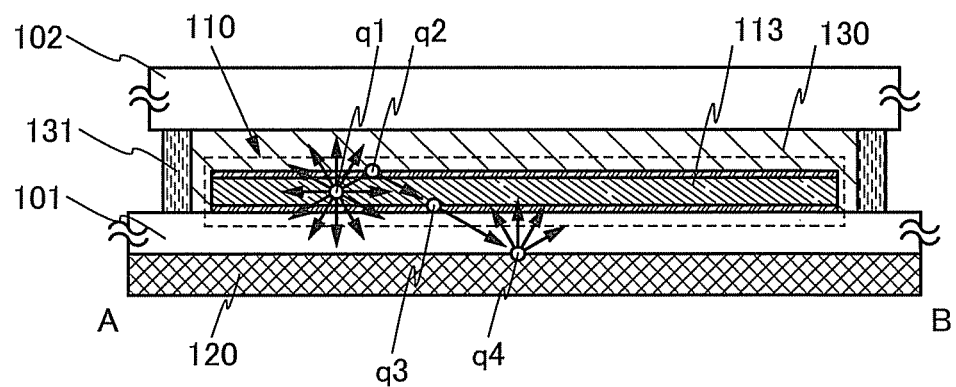
FIGS. 3A and 3B are conceptual diagrams illustrating the locus of a ray of light passing through a light-emitting module according to one embodiment.

Here; a locus of a ray of light emitted from a layer containing a light-emitting organic compound will be described using conceptual diagrams illustrated in FIGS. 3A and 3B. Note that in the conceptual diagrams of the light-emitting module illustrated in FIGS. 3A and 3B, a partition and a terminal are omitted from the cross-sectional view of the light-emitting module in FIG. 1B.

When another light-emitting element is provided in a range where light emitted from one light-emitting element returns to the diffuse reflection layer by the diffuse reflection, light emitted from each light-emitting element is mixed; thus, light emitted from a plurality of light-emitting elements provided adjacently is averaged. Specifically, as illustrated in FIG. 3A, light emitted at a point q1 in the light-emitting element 110 is totally reflected at a point q2, passes through a point q3, and is reflected diffusely at a point q4 on the diffuse reflection layer 120. The light reflected upwardly at the point q4 is mixed with the light emitted from the light-emitting element 110 which is located above the point q4, and is averaged.

With this structure, even when one of the plurality of light-emitting elements emits light abnormally (specifically, the luminance of the light-emitting element is darker or brighter than that of the other light-emitting elements), the abnormal light emission can be averaged and less visible. Specifically, when the element substrate has a thickness of greater than or equal to 50 µm, light emitted from the plurality of light-emitting elements can be averaged and abnormal light emission can be less visible. The same effect can be obtained in the case where a part of the layer containing a light-emitting organic compound provided in a planar manner or in a linear manner has brighter luminance or darker luminance than the other parts.

The light emitted from the light-emitting element to the element substrate side expands in a wider range as the distance between the light-emitting element and the diffuse reflection layer is longer, that is, as the element substrate is thicker. For example, the element substrate 101 in the light-emitting module in FIG. 3B is thicker than that in the light-emitting module in FIG. 3A. As a result, light emitted at the point q1 in the light-emitting element 110 is totally reflected at the point q2, passes through the point q3, and is reflected diffusely at a point q5 on the diffuse reflection layer 120. As shown in the FIGS. 3A and 3B, as the element substrate 101 of the light-emitting module is thicker, the light emitted at the point q1 in the light-emitting element 110 is reflected diffusely at a more distant point (specifically, at the point q5 that is more distant than the point q4). Thus, in the case where the element substrate is too thick, the light may be leaked from the edge portion of the substrate. Specifically, the element substrate preferably has a thickness of less than or equal to 1000 µm. Accordingly, a light-emitting module with improved light extraction efficiency and high reliability can be provided.

Figure 3B:
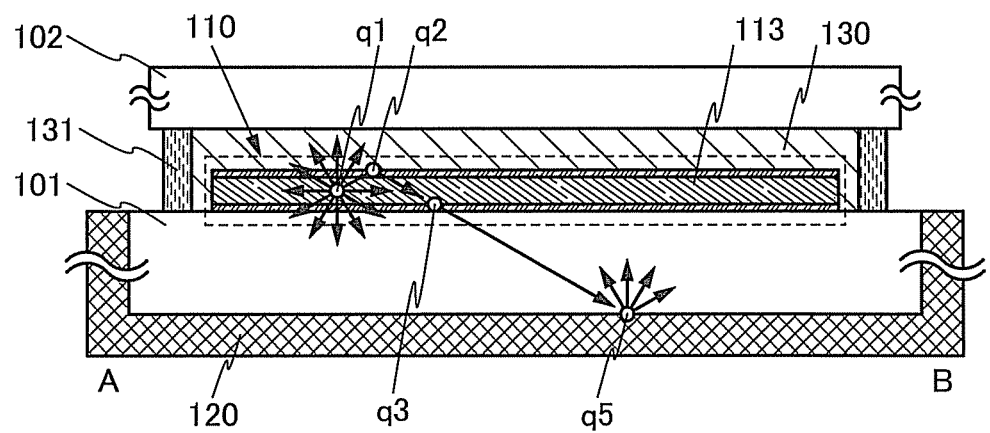

When the element substrate is formed to be thick, the edge portion of the element substrate 101 may be covered with the diffuse reflection layer 120 as shown in FIG. 3B so that light leakage from the edge portion may be reflected diffusely in the interior of the element substrate 101.

《Diffuse Reflection Layer》

The diffuse reflection layer 120 has a diffuse reflectance of greater than or equal to 75% and less than 100% to the light emitted from the light-emitting element 110. Further, the diffuse reflection layer 120 has a transmittance of less than 25% to the light emitted from the light-emitting element 110.

As an example of the structure of the diffuse reflection layer 120, a structure including an element A and an element B is given. In this structure, the element A and the element B each transmit light emitted from the layer 113 containing a light-emitting organic compound and have surfaces with various angles. Further, the refractive index of the element A is higher than or equal to that of the element substrate 101, and the element B has a refractive index that is different from that of the element A by 0.3 or more. A process in which incident light is diffusely reflected by the diffuse reflection layer 120 having such a structure will be described below.

《Case Where Light Proceeds to Element A of Diffuse Reflection Layer 120 from Element Substrate 101》

First, the case where light emitted from the light-emitting element 110 proceeds to the element A of diffuse reflection layer 120 from the element substrate 101 is described. The refractive index of the element A is higher than or equal to that of the element substrate 101; thus, the light emitted from the light-emitting element 110 enters the element A from the element substrate 101 without satisfying the condition for total reflection. There is a case where the light that has entered the element A hardly enters the element substrate 101 from the element A (that is, there is a case where the light emitted from the light-emitting element 110 satisfies the condition for total reflection). However, since the element A has surfaces with various angles, there is a case where a phenomenon of light trapping in the element A does not occur by repeatedly satisfying the condition for total reflection and light enters the element substrate 101.

In a portion where the element B is in contact with the element A, if the refractive index of the element B is lower than that of the element A by 0.3 or more, light hardly enters the element B from the element A (that is, the condition for total reflection is easily satisfied). However, since the element A has surfaces with various angles, there is a case where a phenomenon of light trapping in the element A does not occur by repeatedly satisfying the condition for total reflection and light enters the element B.

Further, when the refractive index of the element B is higher than that of the element A by 0.3 or more, light easily enters the element B from the element A (that is, the condition for total reflection is hardly satisfied). The refractive index of the element B is higher than that of the element substrate 101 and that of the element A; thus, the light that has entered the element B hardly enters the element substrate 101 or the element A (that is, the condition for total reflection is easily satisfied). However, since the element B has surfaces with various angles, the condition for total reflection is repeatedly satisfied. Thus, there is a case where a phenomenon of light trapping in the element B does not occur and light enters the element substrate 101 or the element A.

《Case Where Light Proceeds to Element B of Diffuse Reflection Layer 120 from Element Substrate 101》

Next, the case where light emitted from the light-emitting element 110 proceeds to the element B of the diffuse reflection layer 120 from the element substrate 101 and the refractive index of the element B is higher than or equal to that of the element substrate 101 and higher than that of the element A (that is, the refractive index of the element B is higher than that of the element A which is higher than or equal to that of the element substrate 101, by 0.3 or more) is described.

The light emitted from the light-emitting element 110 enters the element B from the element substrate 101 without satisfying the condition for total reflection. The light that has entered the element B hardly enters the element substrate 101 from the element B (that is, the condition for total reflection is easily satisfied). However, since the element B has surfaces with various angles, the condition for total reflection is repeatedly satisfied. Thus, there is a case where a phenomenon of light trapping in the element B does not occur and light enters the element substrate 101.

In a portion where the element A is in contact with the element B, since the refractive index of the element A is lower than that of the element B by 0.3 or more, light hardly enters the element A from the element B (that is, the condition for total reflection is easily satisfied). However, since the element B has surfaces with various angles, there is a case where a phenomenon of light trapping in the element B does not occur by repeatedly satisfying the condition for total reflection and light enters the element A.

Further, the case where light emitted from the light-emitting element 110 proceeds to the element B of the diffuse reflection layer 120 from the element substrate 101 and the refractive index of the element B is higher than or equal to that of the element substrate 101 and lower than the element A (that is, the refractive index of the element B is lower than that of the element A which is higher than or equal to the element substrate 101, by 0.3 or more) is described.

The light emitted from the light-emitting element 110 enters the element B from the element substrate 101 without satisfying the condition for total reflection. The light that has entered the element B hardly enters the element substrate 101 from the element B (that is, the condition for total reflection is easily satisfied). However, since the element B has surfaces with various angles, the condition for total reflection is repeatedly satisfied. Thus, there is a case where a phenomenon of light trapping in the element B does not occur and light enters the element substrate 101.

In a portion where the element A is in contact with the element B, when the refractive index of the element A is higher than that of the element B by 0.3 or more, light easily enter the element A from the element B (that is, the condition for total reflection is hardly satisfied). The refractive index of the element A is higher than that of the element substrate 101 and that of the element B; thus, the light that has entered the element A hardly enters the element substrate 101 and the element B from the element A (that is, the condition for total reflection is easily satisfied). However, since the element A has surfaces with various angles, there is a case where a phenomenon of light trapping in the element A does not occur by repeatedly satisfying the condition for total reflection and light enters the element substrate 101 and the element B.

Next, the case where light emitted from the light-emitting element 110 proceeds to the element B of diffuse reflection layer 120 from the element substrate 101 and the refractive index of the element B is lower than that of the element substrate 101 and lower than that of the element A (that is the refractive index of the element A is higher than or equal to that of the element substrate 101 and the difference between refractive indices of the element A and the element substrate 101 is less than 0.3, and the refractive index of the element B is lower than that of the element A by 0.3 or more) is described.

Since the refractive index of the element B is lower than that of the element substrate 101, there is a case where the light which proceeds to the element B from the element substrate 101 satisfies the condition for total reflection and the condition for the total reflection is repeatedly satisfied in the element substrate 101. However, the diffuse reflection layer 120 includes the element A and the element B, the element substrate 101 is not in contact with only the element B. Thus, the light totally reflected at a portion where the element substrate 101 is in contact with the element B proceeds to a portion where the element substrate 101 is in contact with the element A in some cases, and a phenomenon of light trapping in the element B does not occur by repeatedly satisfying the condition for total reflection and light enters the element A in some cases.

《 Material Applicable to Element A and Element B》

Materials applicable to the element A and the element B will be described. The element A and the element B each transmit light emitted from the layer 113 containing a light-emitting organic compound and have surfaces with various angles. The refractive index of the element A is higher than or equal to that of the element substrate 101, and the element B has a refractive index that is different from that of the element A by 0.3 or more.

For example, the diffuse reflection layer may be formed in such a manner that either of the element A or the element B is formed to serve as a base material (a matrix material) and the other is dispersed or phase-separated in the base material as a dispersed material.

For the material applicable to the base material, a material which is in contact with the dispersed material at various angles or is phase-separated, and which transmits light emitted from the layer 113 containing an organic compound can be used. Specifically, glass, a resin, a liquid crystal, a liquid, or the like can be used.

For the base material applicable to the element A, a material which transmits light emitted from the layer 113 containing an organic compound and has a refractive index higher than or equal to that of the element substrate 101 can be used. Specifically, crystal glass, a high refractive resin, or the like can be used.

For the base material applicable to the element B, a material which transmits light emitted from the layer 113 containing an organic compound and has a refractive index that is different from that of the element A by 0.3 or more can be used. Specifically, low refractive index glass, a low refractive index resin, crystal glass, a high refractive index resin, or the like can be used.

For the material applicable to the dispersed material dispersed in the base material, a material which is in contact with the base material at various angles and transmits light emitted from the layer 113 containing an organic compound can be used. Specifically, particles having a median particle diameter greater than or equal to 1 μm and less than or equal to 100 μm (inorganic material particles or high molecular particles), air bubble, or a material that is hardly compatible with the base material with a lamellar structure can be used.

For the dispersed material which can be used for the element A, a material which transmits light emitted from the layer 113 containing an organic compound and has a refractive index higher than or equal to that of the element substrate 101 can be used. Specifically, a particle containing crystal glass, a high refractive index resin, silver chloride, titanium oxide, zirconium oxide, zinc oxide, yttrium oxide, barium titanate, or the like can be used.

For the dispersed material which can be used for the element B, a material which transmits light emitted from the layer 113 containing an organic compound and has a refractive index that is different from that of the element A by 0.3 or more can be used. Specifically, low refractive index glass, a low refractive index resin, crystal glass, a high refractive index resin, calcium fluoride, sodium fluoride, magnesium fluoride, lithium fluoride, or the like can be used.

Figure 1C:
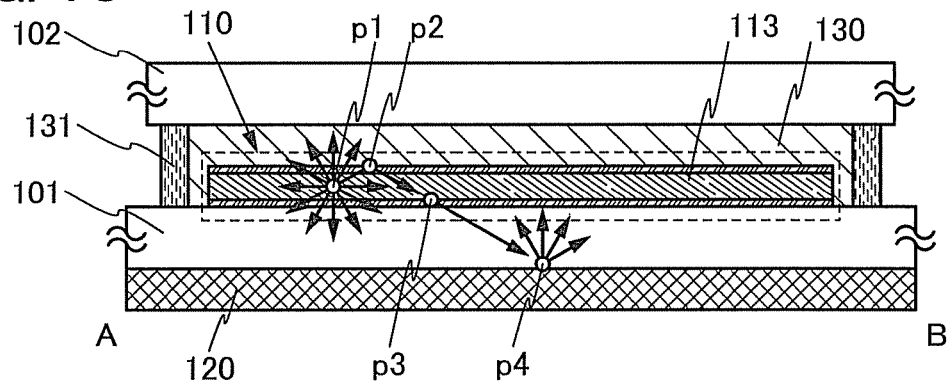
Figure 2A:
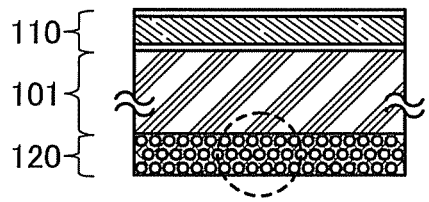
Figure 2A:
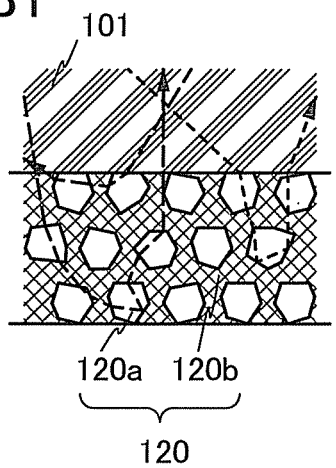
Figure 2A:
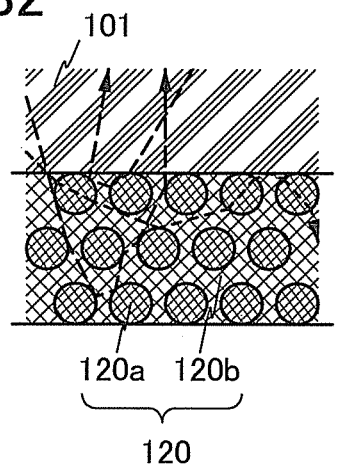
Figure 2A:
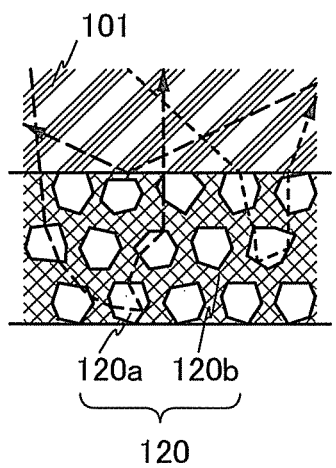
Figure 2A:
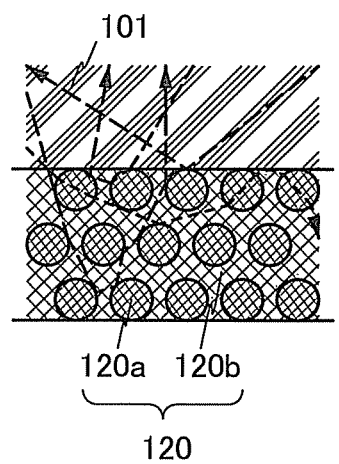

FIGS. 2A to 2E illustrate conceptual diagrams of the diffuse reflection layer according to one embodiment of the present invention. FIG. 2A is a cross-sectional view in which diffuse reflection layer 120 is provided for the other surface of the element substrate 101. Further, FIGS. 2B1 to 2C2 are conceptual diagrams illustrating light proceeding in the range surrounded by a dashed line in FIG. 2A.

The diffuse reflection layer 120 can be formed, for example, in such a manner that a base material 120b (element A) having a refractive index that is higher than or equal to that of the element substrate 101, or different from that of the element substrate 101 by 0.2 or less includes a particle 120a as the dispersed material (element B) having a refractive index that is different from that of the base material 120b by 0.3 or more (see FIGS. 2B1 and 2B2).

The diagram in FIG. 2B1 illustrates the case where the refractive index of the base material 120b is lower than that of the particle 120a and the refractive index of the element substrate 101 is lower than those of the particle 120a and the base material 120b. In this structure, the light emitted from the light-emitting element 110 enters the diffuse reflection layer 120 through the element substrate 101 without satisfying the condition for total reflection, is scattered while passing through the interior of the particle 120a preferentially, and is reflected to the side where the light-emitting element 110 is provided.

The diagram in FIG. 2B2 illustrates the case where the refractive index of the particle 120a is lower than that of the base material 120b and the refractive index of the element substrate 101 is lower than those of the particle 120a and the base material 120b. In this structure, the light emitted from the light-emitting element 110 enters the diffuse reflection layer 120 through the element substrate 101 without satisfying the condition for total reflection, is scattered while passing through the interior of the base material 120b preferentially, and is reflected to the side where the light-emitting element 110 is provided.

Alternatively, the diffuse reflection layer 120 can be formed in such a manner that the particle 120a (element A) having a refractive index higher than or equal to that of the element substrate 101, or different from that of the element substrate 101 by 0.2 or less is included in the base material 120b (element B) having a refractive index that is different from that of the particle 120a by 0.3 or more (see FIGS. 2C1 and 2C2).

The diagram in FIG. 2C1 illustrates the case where the refractive index of the base material 120b is lower than that of the particle 120a and the refractive index of the element substrate 101 is lower than those of the particle 120a and the base material 120b. In this structure, the light emitted from the light-emitting element 110 enters the particle 120a through the element substrate 101 without satisfying the condition for total reflection, is scattered while passing through the interior of the particle 120a preferentially, and is reflected to the side where the light-emitting element 110 is provided. Note that there is a case where the light which is to proceed to the base substrate 120b from the element substrate 101 satisfies the condition for total reflection and hardly enter the base material 120b.

The diagram in FIG. 2C2 illustrates the case where the refractive index of the particle 120a is lower than that of the base material 120b and the refractive index of the element substrate 101 is lower than those of the particle 120a and the base material 120b. In this structure, the light emitted from the light-emitting element 110 enters the base material 120b through the element substrate 101 without satisfying the condition for total reflection, is scattered while passing through the interior of the base material 120b preferentially, and is reflected to the side where the light-emitting element 110 is provided. Note that there is a case where the light which is to proceed to the particle 120a from the element substrate 101 satisfies the condition for total reflection and hardly enters the particle 120a.

In the light-emitting module according to one embodiment of the present invention, light which enters the diffuse reflection layer from the light-emitting element through the element substrate is reflected diffusely to the side where the light-emitting element is provided. Accordingly, a light-emitting module with improved light extraction efficiency and high reliability can be provided.

《 Modification Example 1 of Diffuse Reflection Layer》

Figure 2D:
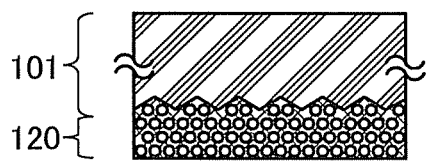

As a modification example of the light-emitting module described in this embodiment, a structure in which unevenness is faulted on the other surface of the element substrate 101 and a diffuse reflection layer is provided so as to be in contact with the unevenness is described with reference to FIG. 2D.

On the other surface of the element substrate 101, unevenness including a face which is not parallel to the one surface of the element substrate 101 is formed. In other words, on a surface opposite to the surface on which the light-emitting element 110 is provided, unevenness including a face which is not parallel to the surface on which the light-emitting element 110 is provided is formed. Further, the particle 120a having a higher refractive index than that of the element substrate 101 and the base material 120b having a lower refractive index than that of the element substrate 101 are provided so as to be in contact with the unevenness.

With this structure, the element substrate 101 has surfaces which are not parallel to each other. Accordingly, the condition for total reflection is not, satisfied repeatedly between the element substrate 101 and the base material 120b, so that a phenomenon of light trapping in the light-emitting module does not occur. Thus, a light-emitting module with improved light extraction efficiency and high reliability can be provided.

《 Modification Example 2 of Diffuse Reflection Layer》

Figure 2E:
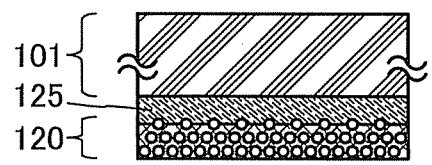

As a modification example of the light-emitting module described in this embodiment, a connection layer 125 having a refractive index that is different from that of the element substrate 101 by 0.2 or less may be formed between the other surface of the element substrate 101 and the diffuse reflection layer 120 (FIG. 2E).

With this structure, the diffuse reflection layer having unevenness on its surface can be connected to the other surface of the element substrate 101. Accordingly, the light which is emitted from the light-emitting element and enters one surface of the diffuse reflection layer through the element substrate is reflected diffusely by the diffuse reflection layer. Thus, a light-emitting module with improved light extraction efficiency and high reliability can be provided.

〈 Sealing Material〉

In the sealing material, a region which transmits light emitted from the light-emitting element 110 is provided so as to overlap with the light-emitting element 110, and the light-emitting element 110 is sealed between the one surface of the element substrate 101 and the sealing material. As the sealing material, a material with gas barrier properties such that the vapor permeability is lower than or equal to $10^{-5}$ g/m$^2$·day, preferably lower than or equal to $10^{-6}$ g/m$^2$·day, is used In this embodiment, an example in which the sealing material is formed using the sealant 131 and the sealing substrate 102 which transmits light emitted from the light-emitting element 110 is described (see FIGS. 1A to 1C). In this structure, the light-emitting element 110 is sealed in a space 130 surrounded by the element substrate 101, the sealing substrate 102, and the sealant 131.

The sealing material is in contact with the one surface of the element substrate with superior gas barrier properties; thus, impurities hardly penetrates into the space 130.

The sealant 131 is provided on the one surface of the element substrate 101 so as to surround the light-emitting element 110, and the element substrate 101 and the sealing substrate 102 are bonded to each other. The sealant 131 has gas barrier properties.

As the material applicable to the sealant 131, for example, fritted glass, an ultraviolet curing epoxy resin, a thermosetting epoxy resin, or the like can be used.

The sealing substrate 102 has the region which transmits light emitted from the light-emitting element 110. When the region is provided to overlap with the second electrode of the light-emitting element 110, a direct lighting-type light-emitting module can be formed. Alternatively, when the region is provided so as not to overlap with the second electrode of the light-emitting element 110, an indirect lighting-type light-emitting module can be formed. Either structure may be selected depending on an intended purpose of the light-emitting module.

Further, the sealing substrate 102 has gas barrier properties. As the material which can be used for the sealing substrate 102, for example, light-transmitting glass, a light-transmitting resin provided with a gas barrier film, light-transmitting ceramics, or the like can be used.

Note that an optical film or the like may be provided so as to overlap with the region of the sealing substrate 102, which transmits light emitted from the light-emitting element 110. Examples of the optical film or the like include a diffusion film, an optical filter, a microlens array, a lenticular lens, and the like.

In the space 130, the concentration of impurities degrading the properties of the light-emitting element 110 is reduced.

An inert gas (e.g., nitrogen, a rare gas, or the like), liquid (e.g., paraffin or the like), or solid (e.g., resin or the like) with respect to the light-emitting element 110 can be used as a material filling the space 130. Specifically, a gas (e.g., nitrogen, a rare gas, or the like) is preferably used. This is not merely because the concentration of impurities in a gas is more easily reduced than that in a liquid or a solid, but also because stress externally applied to the sealing material is not propagated to the light-emitting element 110.

Note that a drying agent or a gettering agent may be sealed with the light-emitting element so as to reduce the concentration of the impurities contained in the material filling the space 130.

⟨Locus of a Ray of Light Emitted from Light-Emitting Organic Compound⟩

Next, the locus of a ray of light emitted from a light-emitting organic compound is described with reference to a conceptual diagram illustrated in FIG. 1C. Note that in the conceptual diagram of the light-emitting module illustrated in FIG. 1C, the partition and the terminal are omitted from the cross-sectional view of the light-emitting module in FIG. 1B.

When the space 130 is filled with a material having a refractive index that is sufficiently lower than that of the layer 113 containing a light-emitting organic compound provided in the light-emitting element 110, there is a case where light emitted from the layer containing a light-emitting organic compound partly enters the interface between the light-emitting element 110 and the space 130 at an angle satisfying the condition for total reflection and is totally reflected at the interface.

Specifically, when the space 130 is filled with an inert gas, there is a case where the condition for total reflection is satisfied since the refractive indices of the space 130 and the layer 113 containing a light-emitting organic compound are approximately 1 and approximately 1.4, respectively. FIG. 1C shows the case where a part of the light emitted at a point p1 in the layer 113 containing a light-emitting organic compound is totally reflected at a point p2 at the interface between the light-emitting element 110 and the space 130. If two interfaces between which the light-emitting element 110 is sandwiched are provided so as to satisfy the condition for total reflection, a waveguide is formed and light emitted from the light-emitting element 110 cannot extract efficiently.

In one embodiment of the present invention, the first electrode of the light-emitting element 110 is optically connected to the one surface of the element substrate 101. Thus, light reflected at the interface between the light-emitting element 110 and the space 130 enters the element substrate 101 and reaches the diffuse reflection layer 120. FIG. 1C shows that the light totally reflected at the point p2 at the interface between the light-emitting element 110 and the space 130 passes through a point p3 at the interface between the light-emitting element 110 and the element substrate 101 and reaches a point p4 in the diffuse reflection layer 120.

At this time, the light that has reached the diffuse reflection layer 120 is reflected diffusely by the diffuse reflection layer 120 and emitted toward the element substrate 101 at various angles (including angles other than the angle of incidence). Accordingly, the probability of satisfying the condition for total reflection at the interfaces between which the light-emitting element 110 is sandwiched simultaneously is lowered. Thus, a light-emitting module with improved light extraction efficiency and high reliability can be provided.

The above-described light-emitting module according to one embodiment of the present invention has a structure in which an element substrate with gas barrier properties is used, a light-emitting element is optically connected to one surface side of the element substrate, and a diffuse reflection layer is provided on the other surface side of the element substrate. Here, the element substrate between the light-emitting element and the diffuse reflection layer has a refractive index that is different from that of the layer containing a light-emitting organic compound by 0.2 or less; thus, part of light emitted from the layer containing a light-emitting organic compound, which travels to the diffuse reflection layer from the first electrode side, reaches the diffuse reflection layer efficiently. The incident light is diffusely reflected by the diffuse reflection layer (the incident light is reflected at various angles including an angle that is different from the angle of incidence); thus, a waveguide is not easily aimed between the diffuse reflection layer and the light-emitting element. Thus, a light-emitting module with improved light extraction efficiency can be provided. In addition, a glass layer formed at a temperature higher than both the formation temperature of the light-emitting element and that of the diffuse reflection layer is provided for at least the one surface of the element substrate; thus, diffusion of impurities into the light-emitting element optically connected to one surface of the element substrate can be suppressed. As a result, a light-emitting module with high reliability can be provided.

Embodiment 2

In this embodiment, a light-emitting module having a different structure from the light-emitting module according to one embodiment of the present invention described in Embodiment 1 will be described. Specifically, a structure in which a conductive layer for supporting the conductivity is provided for each of a first electrode and a second electrode of the light-emitting module will be described.

The light-emitting module described in this embodiment has the following structure: an element substrate with gas barrier properties is used; a light-emitting element is optically connected to one surface side of the element substrate; and a diffuse reflection layer is provided for the other surface side of the element substrate. The diffuse reflection layer has a diffuse reflectance of greater than or equal to 75% and less than 100%. The light-emitting element is provided with a layer containing a light-emitting organic compound between a pair of transparent electrodes. Each of the transparent electrodes is provided with an auxiliary electrode for supporting the conductivity, and the auxiliary electrodes are electrically insulated from each other and are provided so as to overlap with each other. The element substrate transmits light emitted from the light-emitting element and has a refractive index that is different from that of the light-emitting organic compound by 0.2 or less. Further, the element substrate is formed at a temperature higher than both the formation temperature of the light-emitting element and that of the diffuse reflection layer.

The above-described light-emitting module according to one embodiment of the present invention has a structure in which an element substrate with gas barrier properties is used, a light-emitting element is optically connected to one surface side of the element substrate, and a diffuse reflection layer is provided on the other surface side of the element substrate. Here, the element substrate between the light-emitting element and the diffuse reflection layer has a refractive index that is different from that of the layer containing a light-emitting organic compound by 0.2 or less; thus, part of light emitted from the layer containing a light-emitting organic compound, which travels to the diffuse reflection layer from the first electrode side, reaches the diffuse reflection layer efficiently. The incident light is diffusely reflected by the diffuse reflection layer (the incident light is reflected at various angles including an angle that is different from the angle of incidence); thus, a waveguide is not easily formed between the diffuse reflection layer and the light-emitting element. Thus, a light-emitting module with improved light extraction efficiency can be provided.

Each of the transparent electrodes is provided with an auxiliary electrode for supporting the conductivity, and the auxiliary electrodes are provided so as to overlap with each other. With this structure, the ratio of the area of the auxiliary electrodes to the area of the light-emitting element can be decreased. Specifically, when the auxiliary electrodes are formed using a conductive layer which does not transmit light (e.g., a metal layer), the area where light is extracted can be increased, and uniform light emission can be obtained compared to the case where the auxiliary electrodes are formed so as not to overlap with each other.

In addition, at least one surface of the element substrate is provided with a glass layer formed at a temperature higher than both the formation temperature of the light-emitting element and that of the diffuse reflection layer; thus, diffusion of impurities into the light-emitting element optically connected to one surface of the element substrate can be suppressed. As a result, a light-emitting module with high reliability can be provided.

A light-emitting module having the above-described structure according to one embodiment of the present invention will be described with reference to FIGS. 4A to 4C.

Figure 4A:
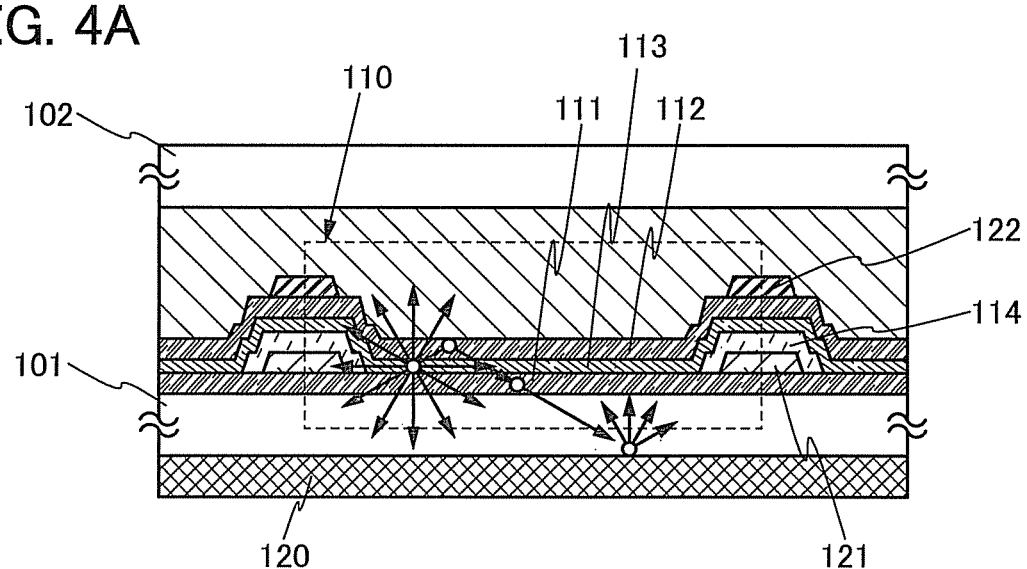
FIGS. 4A to 4C each illustrate an auxiliary electrode of a light-emitting module according to one embodiment.
Figure 4B:
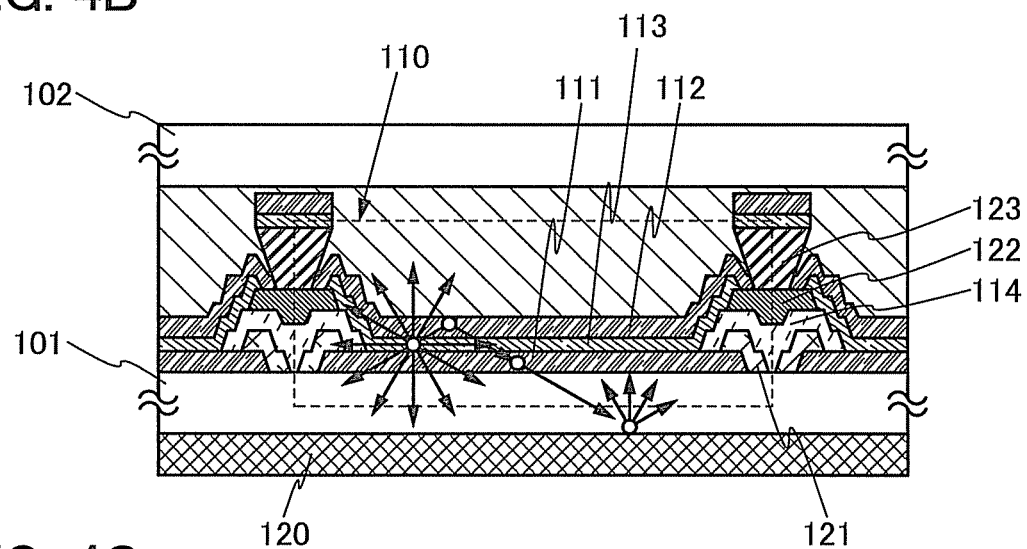
Figure 4C:
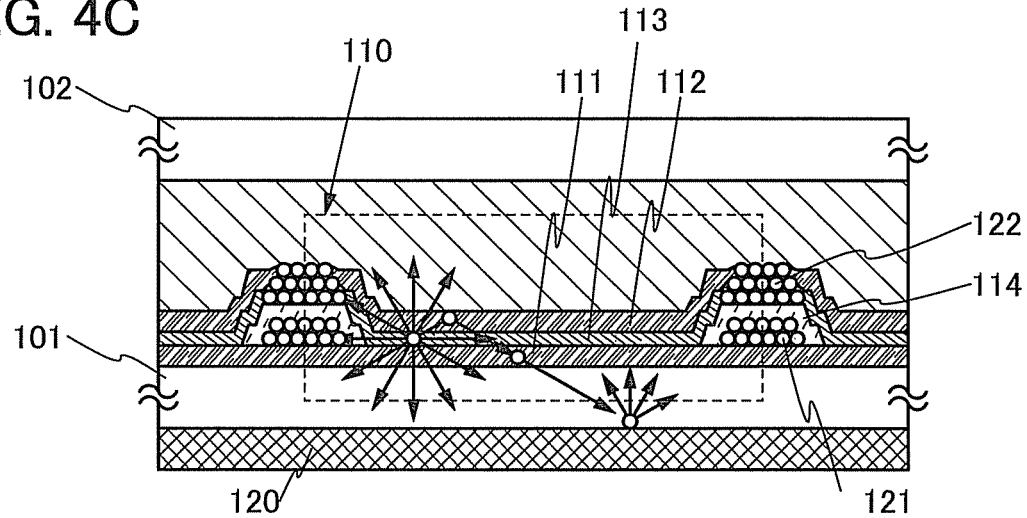

FIGS. 4A to 4C each illustrate a structure of the light-emitting module according to one embodiment of the present invention. FIG. 4A is a cross-sectional view of the light-emitting module according to one embodiment of the present invention, and FIGS. 4B and 4C are cross sectional views of the light-emitting modules each having a different structure from that of the light-emitting module in FIG. 4A.

The light-emitting module illustrated in FIG. 4A includes an element substrate 101 with gas barrier properties, a light-emitting element 110, a sealing substrate 102 provided so as to face the element substrate 101 using a sealant that is not shown, and a diffuse reflection layer 120. The light-emitting element 110 includes a first electrode 111 optically connected to one surface of the element substrate 101 and is sealed between the one surface of the element substrate 101 and a sealing material. A first auxiliary electrode 121 is electrically connected to the first electrode 111, and a second auxiliary electrode 122 is electrically connected to a second electrode 112. A partition 114 is fainted between the first auxiliary electrode 121 and the second auxiliary electrode 122 so that the first electrode 111 is electrically insulated from the second electrode 112.

The light-emitting module described in this embodiment has the same structure as that described in Embodiment 1 except that each of the transparent electrodes is provided with an auxiliary electrode for supporting conductivity and the auxiliary electrodes are provided so as to overlap with each other. Thus, in this embodiment, description of Embodiment 1 is referred to for the structure of the light-emitting module other than the structure of the auxiliary electrodes, and detailed description thereof is omitted here.

( Auxiliary Electrode)

The first auxiliary electrode 121 supports the conductivity of the first electrode 111, and the second auxiliary electrode 122 supports the conductivity of the second electrode 112. The first auxiliary electrode 121 and the second auxiliary electrode 122 are preferably formed using materials with high conductivity. The larger the cross-sectional areas of the first auxiliary electrode 121 and the second auxiliary electrode 122 are, the more effectively the first auxiliary electrode 121 and the second auxiliary electrode 122 work.

Note that there is no particular limitation on the modes of the auxiliary electrodes; for example, the auxiliary electrodes may have a stripe shape, an island shape, or a net-like shape.

The first auxiliary electrodes 121 and the second auxiliary electrode 122 are each formed to have a single layer structure or a stacked structure using a conductive metal, a conductive alloy, an electrically conductive compound, a mixture thereof, and the like.

Examples of the metal or the alloy material include gold (Au), platinum (Pt), nickel (Ni), tungsten (W), chromium (Cr), molybdenum (Mo), iron (Fe), cobalt (Co), copper (Cu), palladium (Pd), titanium (Ti), and the like, and an alloy thereof.

Examples of the electrically conductive compound include an oxide of a metal material, a nitride of a metal material, and a conductive high molecule.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, indium zinc oxide containing tungsten, and the like. Specific examples of the oxide of a metal material further include molybdenum oxide, vanadium oxide, ruthenium oxide, tungsten oxide, manganese oxide, titanium oxide, and the like.

Specific examples of the nitride of a metal material include titanium nitride, tantalum nitride, and the like.

Specific examples of the conductive high molecule include poly(3,4-ethylenedioxythiophene)/poly(styrenesulfonic acid) (PEDOT/PSS), polyaniline/poly(styrenesulfonic acid) (PAni/PSS), and the like.

The first auxiliary electrode 121 is formed in such a manner that a conductive metal layer is formed over the first electrode 111 and is processed into a desired shape by a photolithography method. Alternatively, a shadow mask method, a printing method, an inkjet method, or the like may be used.

The second auxiliary electrode 122 may be formed by, for example, a shadow mask method.

When the first electrode 111 and/or the second electrode 112 have/has high electric resistance (also referred to as sheet resistance), luminance unevenness occurs in a light-emitting element due to a voltage drop in the surface(s) of the electrode(s). This problem is particular noticeable in the case where the area(s) of the first electrode 111 and/or the second electrode 112 is/are large. However, the light-emitting module according to this embodiment has the electrodes each provided with the auxiliary electrode; thus, the voltage drop hardly occurs in the surface(s) of the electrode(s) and luminance unevenness hardly occurs in the light-emitting element.

When both the first auxiliary electrode 121 and the second auxiliary electrode 122 are provided, it is preferable that both of them be provided so as to overlap with each other. This is because the ratio of the areas of the auxiliary electrodes to the area of the light-emitting element can be decreased with this structure. Specifically, in the case where each of the auxiliary electrodes is formed using a conductive layer which does not transmit light (e.g., a metal layer), the area where light is extracted can be increased, and uniform light emission can be obtained compared to the case where the auxiliary electrodes are formed so as not to overlap with each other.

〈Modification Example 1 of Auxiliary Electrode〉

As a modification example 1 of the auxiliary electrode, a structure different from that of FIG. 4A is shown in FIG. 4B. In the structure of FIG. 4B, a reversely tapered structure 123 is provided over the second auxiliary electrode 122, and a region where the layer 113 containing a light-emitting organic compound is not formed is formed in a region under the upper portion of the reversely tapered structure 123 (that is, the periphery of the portion where the bottom of the reversely tapered structure 123 is in contact with the second auxiliary electrode 122). The second auxiliary electrode 122 is electrically connected to the second electrode 112 at the region.

The reversely tapered structure 123 may have insulating properties or conductive properties. For example, the reversely tapered structure 123 having insulating properties may be formed using photopolymer; alternatively, a conductive layer may be processed into a reversely tapered structure having conductive properties through a photolithography step.

According to the modification example 1 of the auxiliary electrode, the second auxiliary electrode can be formed before the formation of the layer 113 containing a light-emitting organic compound. There is no possibility that impurities are diffused into the layer 113 containing a light-emitting organic compound in the formation of the layer 113, whereby the second auxiliary electrode can be formed by various methods. Specifically, a photolithography method, a printing method, an inkjet method, or the like can be used other than a shadow mask method.

Note that when the layer 113 containing a light-emitting organic compound is formed by highly anisotropic deposition, for example, by a vacuum evaporation method, a region where the layer 113 containing a light-emitting organic compound is not formed is formed in the region under the upper portion of the reversely tapered structure 123 (that is, the periphery of the portion where the bottom of the reversely tapered structure 123 is in contact with the second auxiliary electrode 122).

After that, when the second electrode 112 is formed by more isotropic deposition (e.g., a sputtering method, or a vacuum evaporation method in which vacuum evaporation is performed from an oblique angle to a substrate) compared to the method for forming the layer 113 containing a light-emitting organic compound, the second electrode 112 can be formed in the region under the upper portion of the reversely tapered structure 123 (that is, the periphery of the portion where the bottom of the reversely tapered structure 123 is in contact with the second auxiliary electrode 122), and the second auxiliary electrode 122 can be electrically connected to the second electrode 112.

Note that in the modification example 1 of the auxiliary electrode of this embodiment, the first electrode 111 of the light-emitting element 110 is electrically separated from a first electrode of an adjacent light-emitting element. With such a structure, the light-emitting element 110 can be independently turned on. Further, the light-emitting element 110 can be connected to other light-emitting elements in parallel or in series to be turned on, so that a light-emitting module that can be turned on in a variety of modes can be provided.

《Modification Example 2 of Auxiliary Electrode》

As a modification example 2 of the auxiliary electrode, a structure different from those of FIGS. 4A and 4B is illustrated in FIG. 4C. In the structure illustrated in FIG. 4C, the first auxiliary electrode 121 supports the conductivity of the first electrode 111, and the second auxiliary electrode 122 supports the conductivity of the second electrode 112. Further, the first auxiliary electrode 121 is electrically separated from the second auxiliary electrode 122 by the partition 114 covering the first auxiliary electrode 121.

The second auxiliary electrode 122 used in the modification example 2 of the auxiliary electrode of this embodiment includes conductive particles. The particle size of the particle is determined so that the particle is not covered with the layer 113 containing a light-emitting organic compound. Specifically, a particle with a size of greater than or equal to 100 nm and less than or equal to 100 μm, preferably greater than or equal to 1 μm and less than or equal to 50 μm is included. The shape of the conductive particle is not limited to a spherical shape and may be polygonal shape or an irregular shape.

The layer 113 containing a light-emitting organic compound, which is formed to overlap with the second auxiliary electrode 122, cannot cover the particles contained in the second auxiliary electrode, and a part of the particles are exposed from the layer 113 containing a light-emitting organic compound. For example, when the layer 113 containing a light-emitting organic compound with a thickness of several hundreds of nanometers is formed by highly anisotropic deposition (specifically, by a vacuum evaporation method), a film is not formed over a portion which does not face an evaporation source of the particles (in other words, the shadow portion of the particles) and a part of the particles is exposed from the layer 113 containing a light-emitting organic compound.

The second electrode 112 is electrically connected to the particles contained in the second auxiliary electrode 122, which are exposed from the layer 113 containing a light-emitting organic compound. For example, when the second electrode 112 is formed by more isotropic deposition (e.g., a sputtering method, or a vacuum deposition method in which vacuum deposition is performed from an oblique angle to a substrate) compared to the method for forming the layer 113 containing a light-emitting organic compound, the second electrode 112 can be formed over the exposed particles contained in the second auxiliary electrode 122.

Note that in the modification example 2 of the auxiliary electrode of this embodiment, the first auxiliary electrode 121 can also contain conductive particles. When the first auxiliary electrode 121 contains conductive particles, the partition 114 with an enough thickness is formed by a method by which favorable coverage is obtained so as to cover the particles sufficiently. For example, the partition 114 with a thickness of about several tens of micrometers may be formed of an insulating resin by a printing method (specifically, a screen printing method) so as to cover the conductive particles contained in the first auxiliary electrode 121.

As the conductive particles, it is possible to use particles covered with a conductive layer in addition to metal particles, semiconductor particles, or particles of silver halide. Specifically, silver (Ag), gold (Au), copper (Cu), nickel (Ni), platinum (Pt), palladium (Pd), tantalum (Ta), molybdenum (Mo), or titanium (Ti), or an alloy containing any one of these metals can be used.

As a method for forming the second auxiliary electrode 122 containing the conductive particles, for example, a printing method, an inkjet method, or the like can be used. Note that, the second auxiliary electrode 122 may contain any one of a binding agent, a solvent, and a dispersing agent in addition to the conductive particles, and is subjected to baking, whereby the second auxiliary electrode 122 may be formed.

This embodiment can be combined with any of the other embodiments in this specification as appropriate.

Embodiment 3

In this embodiment, a method of manufacturing a light-emitting module according to one embodiment of the present invention is described. Specifically, a method for manufacturing a light-emitting module having a structure in which an element substrate with gas barrier properties is used, a light-emitting element is optically connected to one surface side of the element substrate, and a diffuse reflection layer is provided for the other surface side thereof is described. The diffuse reflection layer has a diffuse reflectance of greater than or equal to 75% and less than 100%. Further, a layer containing a light-emitting organic compound is provided between a pair of transparent electrodes. The element substrate transmits light emitted from the light-emitting element and has a refractive index that is different from that of the layer containing a light-emitting organic compound by 0.2 or less. The formation temperature of the element substrate is higher than both the formation temperature of the light-emitting element and that of the diffuse reflection layer.

More specifically, a method for manufacturing a light-emitting module including first, second, and third steps are described with reference to FIGS. 5A to 5C. In the first step, a light-emitting element in which a layer containing a light-emitting organic compound is provided between a first electrode and a second electrode is formed. Here, the first electrode is provided so as to be optically connected to one surface of the element substrate having gas barrier properties, and the second electrode is provided to overlap with the first electrode. In the second step, the light-emitting element is sealed between the one surface of the element substrate and a sealing material. In the third step, a diffuse reflection layer is formed on the other surface of the element substrate.

In the method for manufacturing a light-emitting module according to one embodiment of the present invention, a light-emitting element is provided on the one surface of the element substrate and sealed, and the diffuse reflection layer is provided on the other surface of the element substrate, that is, the surface opposite to the surface on which the light-emitting element is sealed. Accordingly, a method for manufacturing a light-emitting module with improved light extraction efficiency and reliability can be provided.

The formation of the light-emitting element requires an extremely clean environment so as to prevent a decrease in reliability due to mixture of impurities. However, in the method for manufacturing a light-emitting module according to one embodiment of the present invention, the diffuse reflection layer can be formed also in an environment which is not as clean as the environment for forming the light-emitting element since the light-emitting element is sealed after the formation of the light-emitting element. Thus, a light-emitting module with improved light extraction efficiency and high reliability can be provided using simplified manufacturing facilities.

In this embodiment, a method for manufacturing a light-emitting module 100 illustrated in FIGS. 1A to 1C is described.

⟨First Step⟩

Figure 5A:
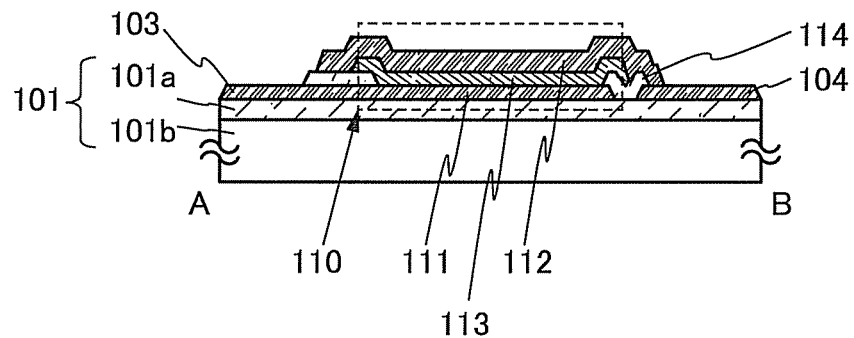
FIGS. 5A to 5C each illustrate a method for manufacturing a light-emitting module according to one embodiment.

In the first step, the light-emitting element 110 is formed in which the layer 113 containing a light-emitting organic compound is provided between the first electrode 111 and the second electrode 112 (see FIG. 5A). Here, the first electrode 111 is provided so as to be optically connected to one surface of the element substrate 101 with gas barrier properties, and the second electrode 112 is provided so as to overlap with the first electrode 111.

First, a light-transmitting conductive layer is formed over the glass layer 101a of the element substrate 101. Next, a conductive layer including the first electrode 111, the first terminal 103 electrically connected to the first electrode 111, and the second terminal 104 is formed by a photolithography method. Further, the partition 114 covering the edge portion of the first electrode 111 and having an opening overlapping with the first electrode 111 is formed. Further, the layer 113 containing a light-emitting organic compound is formed over the first electrode 111, and the second electrode 112 is formed to overlap with the first electrode 111 so that the layer 113 containing a light-emitting organic compound is sandwiched therebetween.

Note that the glass layer 101a is formed at a temperature higher than both the formation temperature of the light-emitting element and that of the diffuse reflection layer; thus, impurities which degrades the reliability of the light-emitting element 110 are hardly released from the glass layer 101a.

Further, a flat surface of the first electrode can be easily formed; thus, the first electrode and the second electrode are hardly short-circuited. Accordingly, a light-emitting module with improved light extraction efficiency and high reliability can be provided.

⟨Second Step⟩

Figure 5B:
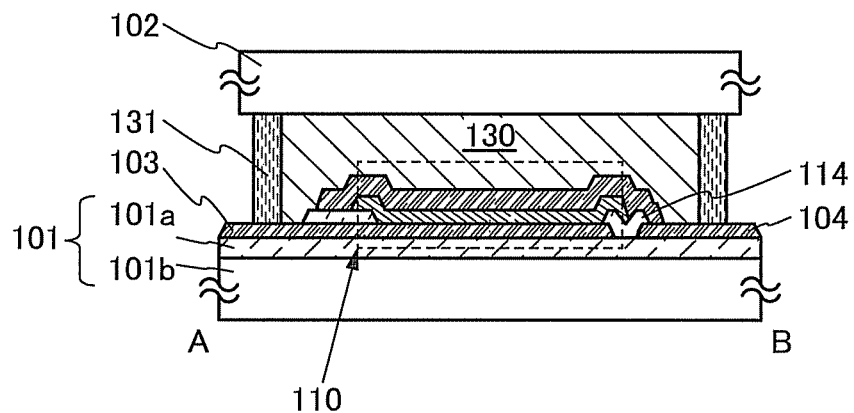

In the second step, the light-emitting element 110 is sealed between the one surface of the element substrate 101 and the sealing material (see FIG. 5B). Note that in this embodiment, a sealing material is formed using the sealing substrate 102, and an ultraviolet curing epoxy resin as the sealant 131.

The sealant 131 is formed on the sealing substrate 102 using a dispenser so as to surround the light-emitting element 110. Next, the sealing substrate 102 and the glass layer 101a of the light-emitting substrate 101 with the sealant 131 provided therebetween are irradiated with ultraviolet light to be cured, so that the light-emitting element 110 is sealed between the sealing substrate 102 and the glass layer 101a.

When fitted glass is used for the sealant 131, for example, a dispersing material containing fitted glass and a medium is formed on the sealing substrate 102 using a dispenser so as to surround the light-emitting element 110. Next, the dispersing material is heated to remove the medium, so that the sealant 131 containing fritted glass is formed. Next, the sealing substrate 102 and the glass layer 101a of the element substrate 101 with the sealant 131 provided therebetween is subjected to laser irradiation so as to be fused, so that the light-emitting element 110 is sealed between the sealing substrate 102 and the glass layer 101a.

Note that the possibility that impurities are diffused into the light-emitting element is reduced after the light-emitting element 110 is sealed; thus, a clean environment which is required in the first and the second steps is not needed in and after the third step.

⟨Third Step⟩

Figure 5C:
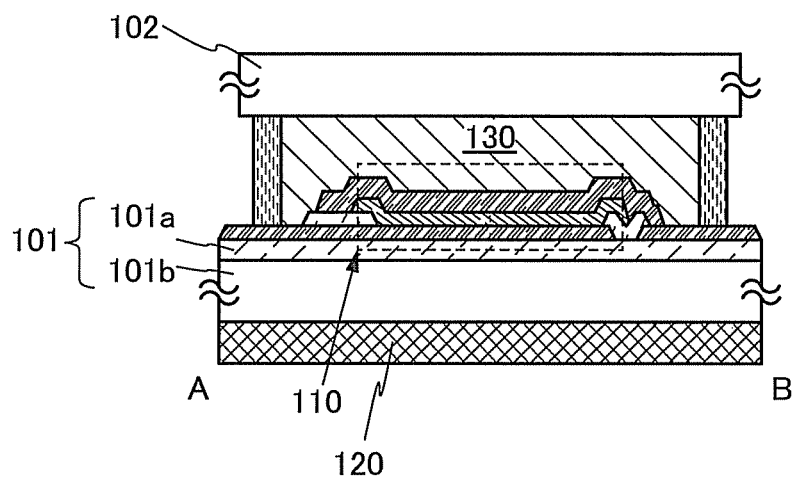

In the third step, the diffuse reflection layer is formed on the other surface of the element substrate (that is, on the surface on which the light-emitting element is not formed) (see FIG. 5C).

As the formation method of the diffuse reflection layer, various methods such as a printing method and a transfer method can be applied.

When a printing method is used, a composition in which a base material and a particle having different refractive indices are contained in a solvent is printed on the other surface of the element substrate 101 and then dried or hardened, whereby the diffuse reflection layer 120 can be formed.

When a transfer method is used, for example, a composition containing a base material and a particle having different refractive indices is formed over a process paper in a layered shape and then the composition in a layered shape is transferred to the other surface of the element substrate 101, whereby the diffuse reflection layer 120 can be formed. In transferring, for example, a sticky base material may be used; alternatively, the composition in a layered structure may be bonded to the other surface of the element substrate 101 using an adhesive or an adhesion material. When an adhesive or an adhesion material is used, the refractive index thereof is preferably approximately the same degree as that of the element substrate 101 (specifically, the refractive index of the adhesive or the adhesion material is different from that of the element substrate 101 by 0.2 or less).

In the method for manufacturing a light-emitting module according to one embodiment of the present invention, the light-emitting element is provided on the one surface of the element substrate and sealed, and the diffuse reflection layer is provided on the other surface of the element substrate (that is, the surface opposite to the surface on which the light-emitting element is sealed). Accordingly, a method for manufacturing a light-emitting module with improved light extraction efficiency and reliability can be provided.

The formation of the light-emitting element usually requires an extremely clean environment so as to prevent a decrease in reliability due to mixture of impurities. However, in the method for manufacturing a light-emitting module according to one embodiment of the present invention, the light-emitting element is sealed after the formation of the light-emitting element and before the formation of the diffuse reflection layer. Thus, the diffuse reflection layer can be formed also in an environment which is not as clean as the environment for forming the light-emitting element. Thus, a light-emitting module with improved light extraction efficiency and high reliability can be provided using simple manufacturing facilities.

Embodiment 4

In this embodiment, a structure of a light-emitting element which can be used for the light-emitting module according to one embodiment of the present invention will be described. Specifically, an example of a light-emitting element in which a layer containing a light-emitting organic compound is provided between a pair of electrodes is described with reference to FIGS. 6A to 6E.

The light-emitting element described in this embodiment as an example includes a first electrode, a second electrode, and a layer containing a light-emitting organic compound provided between the first electrode and the second electrode. Note that one of the first electrode and the second electrode functions as an anode, and the other functions as a cathode. The EL layer is provided between the first electrode and the second electrode, and a structure of the EL layer may be appropriately selected in accordance with materials of the first electrode and second electrode. An example of the structure of the light-emitting element will be described below; it is needless to say that the structure of the light-emitting element is not limited to this example.

⟨Structure Example 1 of Light-Emitting Element⟩

Figure 6A:
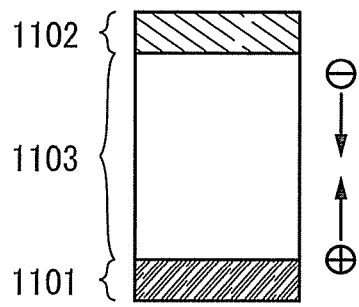
FIGS. 6A to 6E each illustrate a light-emitting element which can be used for a light-emitting module according to one embodiment.

An example of a structure of a light-emitting element is illustrated in FIG. 6A. In the light-emitting element illustrated in FIG. 6A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, it can be said that Structure Example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 6B:
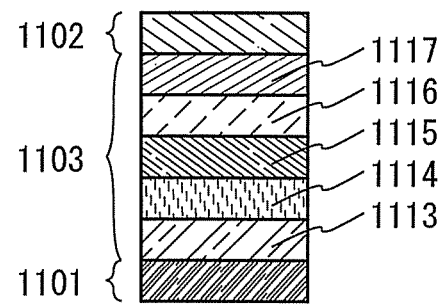

An example of a specific structure of the light-emitting unit 1103 is illustrated in FIG. 6B. In the light-emitting unit 1103 illustrated in FIG. 6B, a hole-injection layer 1113, a hole-transport layer 1114, a light-emitting layer 1115, an electron-transport layer 1116, and an electron-injection layer 1117 are stacked in this order from the anode 1101 side.

⟨Structure Example 2 of Light-Emitting Element⟩

Figure 6C:
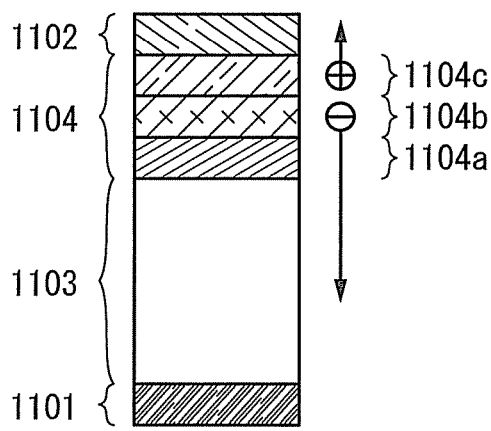

Another example of the structure of the light-emitting element is illustrated in FIG. 6C. In the light-emitting element illustrated in FIG. 6C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit included in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 may be formed to include at least a charge generation region, and may have a structure in which the charge generation region and a layer other than the charge generation region are stacked. For example, a structure can be employed in which a first charge generation region 1104*c*, an electron-relay layer 1104*b*, and an electron-injection buffer 1104*a* are stacked in that order from the cathode 1102 side.

The behaviors of electrons and holes in the intermediate layer 1104 are described. When a voltage greater than the threshold voltage of the light-emitting element is applied between the anode 1101 and the cathode 1102, in the first charge production region 1104*c*, holes and electrons are produced, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance included in the first charge generation region 1104c and the substance included in the electron-injection buffer 1104a react with each other at the interface thereof and the functions of the first charge generation region 1104c and the electron-injection buffer 1104a are damaged.

The range of choices of materials that can be used for the cathode in Structure Example 2 of the light-emitting element is wider than that of materials that can be used for the cathode in Structure Example 1 of the light-emitting element. This is because a material having a relatively high work function can be used for the cathode in Structure Example 2 as long as the cathode in Structure Example 2 receives at least holes generated by the intermediate layer.

⟨Structure Example 3 of Light-Emitting Element⟩

Figure 6D:
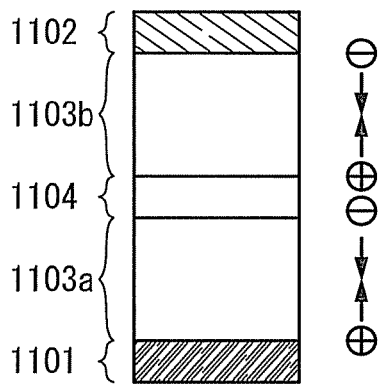
Figure 6E:
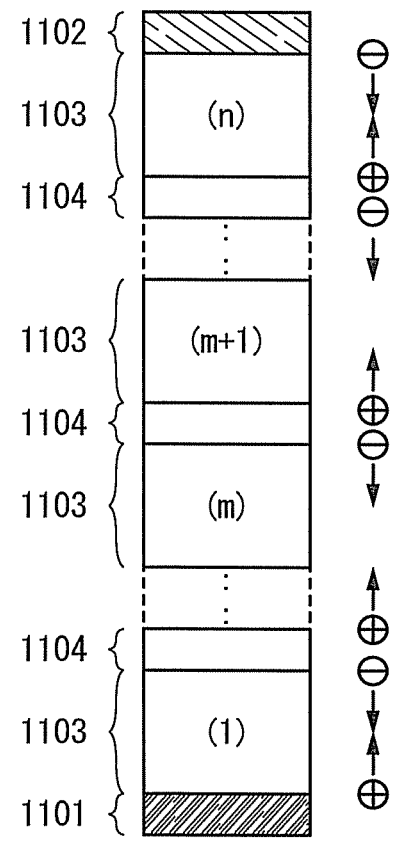

Another example of a structure of a light-emitting element is illustrated in FIG. 6D. In the light-emitting element illustrated in FIG. 6D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 6E has a structure in which a plurality of light-emitting units 1103 are stacked, that is, a so-called tandem structure. Note that in the case where n (n is a natural number greater than or equal to 2) light-emitting units 1103 are provided between the anode and the cathode, the intermediate layer 1104 is provided between an m-th (m is a natural number greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Thus, for the details, the description of the Structure Example 1 of the light-emitting element or the Structure Example 2 of the light-emitting element can be referred to.

The behaviors of electrons and holes in the intermediate layer 1104 provided between the light-emitting units will be described. When voltage greater than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

The structure examples 1 to 3 of the light-emitting element can be implemented in combination. For example, an intermediate layer may be provided between the cathode and the light-emitting unit in Structure Example 3 of the light-emitting element.

⟨Material for Light-Emitting Element⟩

Next, specific materials that can be used for the light-emitting elements having the above structures will be described; materials for the anode, the cathode, and the EL layer will be described in this order.

⟨Material for Anode⟩

The anode 1101 can be formed to have a single layer or a stacked layer using a material with conductivity, for example, a metal, an alloy, or an electrically conductive compound, or a mixture thereof. In particular, a structure in which a material with a high work function (specifically, 4.0 eV or more) is in contact with an EL layer is preferable.

Examples of the metal or the alloy material include gold (Au), platinum (Pt), nickel (Ni), tungsten (W), chromium (Cr), molybdenum (Mo), iron (Fe), cobalt (Co), copper (Cu), palladium (Pd), and titanium (Ti), and an alloy containing any of these.

Examples of the electrically conductive compound include an oxide of a metal material, a nitride of a metal material, and a conductive high molecule.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, and indium zinc oxide containing tungsten. Further, the examples also include molybdenum oxide, vanadium oxide, ruthenium oxide, tungsten oxide, manganese oxide, and titanium oxide.

A film of the oxide of a metal material is usually formed by a sputtering method, but may be formed by application of a sol-gel method or the like. For example, an indium-zinc oxide film can be formed by a sputtering method using a target in which zinc oxide is added to indium oxide at greater than or equal to 1 wt % and less than or equal to 20 wt %. A film of indium oxide containing tungsten oxide and zinc oxide can be formed by a sputtering method using a target in which tungsten oxide and zinc oxide are added to indium oxide at greater than or equal to 0.5 wt % and less than or equal to 5 wt % and greater than or equal to 0.1 wt % and less than or equal to 1 wt %, respectively.

Specific examples of the nitride of a metal material include titanium nitride and tantalum nitride.

Specific examples of the conductive high molecule include poly(3,4-ethylenedioxythiophene)/poly(styrenesulfonic acid) (PEDOT/PSS), polyaniline/poly(styrenesulfonic acid) (PAni/PSS), and the like.

Note that in the case where the second charge generation region is provided in contact with the anode 1101, a variety of electrically conductive materials can be used for the anode 1101 regardless of the size of their work functions. Specifically, besides a material which has a high work function, a material which has a low work function can also be used for the anode 1101. A material for forming the second charge generation region will be subsequently described together with a material for Miming the first charge generation region.

⟨Material for Cathode⟩

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For example, when one of the cathode 1102 and the anode 1101 is formed using a conductive film which transmits visible light and the other is formed using a conductive film which reflects visible light, a light-emitting element which emits light from one side can be formed. Alternatively, when both the cathode 1102 and the anode 1101 are formed using conductive films which transmit visible light, a light-emitting element which emits light from both sides can be formed.

Examples of the conductive film which transmits visible light include a film of indium, tin oxide (ITO), a film of indium tin oxide containing silicon or silicon oxide, a film of indium tin oxide containing titanium, a film of indium titanium oxide, a film of indium tungsten oxide, a film of indium zinc oxide, and a film of indium zinc oxide containing tungsten. Further, a metal thin film having a thickness enough to transmit light (preferably, approximately 5 nm to 30 nm) can also be used.

For the conductive film which reflects visible light, a metal is used, for example. Specific examples thereof include metal materials such as silver, aluminum, platinum, gold, and copper, and an alloy material containing any of these. As examples of the alloy containing silver, a silver-neodymium alloy, a magnesium-silver alloy, and the like can be given. As examples of the alloy of aluminum, an aluminum-nickel-lanthanum alloy, an aluminum-titanium alloy, and an aluminum-neodymium alloy can be given.

⟨Material for EL Layer⟩

Specific examples of materials for the layers included in the light-emitting unit 1103 will be given below.

The hole-injection layer is a layer having a high hole injection property. As the substance having a high hole injection property, for example, molybdenum oxide, vanadium oxide, ruthenium oxide, tungsten oxide, manganese oxide, or the like can be used. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonic acid) (PEDOT/PSS), or the like to form the hole injection layer.

Note that the hole-injection layer may be formed using the second charge generation region. When the second charge generation region is used for the hole-injection layer, a variety of conductive materials can be used for the anode 1101 regardless of their work functions as described above. A material for faulting the second charge generation region will be subsequently described together with a material for forming the first charge generation region.

⟨Hole-Transport Layer⟩

The hole-transport layer is a layer that contains a substance with a high hole-transport property. The hole-transport layer is not limited to a single layer, but may be a stack of two or more layers each containing a substance having a high hole-transport property. The hole-transport layer contains any substance having a greater hole-transport property than an electron-transport property, and preferably contains a substance having a hole mobility of $10^{-6}$ $cm^2/V \cdot s$ or greater because the driving voltage of the light-emitting element can be reduced.

As the substance having a high hole-transport property, an aromatic amine compound such as 4,4'-bis[N-(1-naphthyl)-N-phenylamino]biphenyl (abbreviation: NPB Or a-NPD), or a carbazole derivative such as 9-[4-(10-phenyl-9-anthracenyl)phenyl]-9H-carbazole (abbreviation: CzPA) can be given. Further, a high molecular compound (e.g., poly(N-vinylcarbazole) (abbreviation: PVK)), or the like can be used.

⟨Light-Emitting Layer⟩

The light-emitting layer contains a light-emitting substance. The light-emitting layer is not limited to a single layer, but may be a stack of two or more layers containing light-emitting substances. As the light-emitting substance, a fluorescent compound or a phosphorescent compound can be used. A phosphorescent compound is preferably used as the light-emitting substance because the emission efficiency of the light-emitting element can be increased.

A fluorescent compound (e.g., coumarin 545T), a phosphorescent compound (e.g., tris(2-phenylpyridinato)iridium (III) (abbreviation: $Ir(ppy)_3$), or the like, can be used for the light-emitting substance.

Note that those light-emitting substances are preferably dispersed in a host material. A host material preferably has greater excitation energy than the light-emitting substance.

As the material which can be used as the host material, the above-described substance having a high hole-transport property (e.g., an aromatic amine compound, a carbazole derivative, and a high molecular compound), a substance having a high electron-transport property (e.g., a metal complex having a quinoline skeleton or a benzoquinoline skeleton and a metal complex having an oxazole-based ligand or a thiazole-based ligand), which will be described later, or the like can be used.

⟨Electron-Transport Layer⟩

The electron-transport layer is a layer containing a substance with a high electron-transport property. The electron-transport layer is not limited to a single layer, but may be a stack of two or more layers each containing a substance having a high electron-transport property. The electron-transport layer contains any substance having a greater electron-transport property than a hole-transport property, and preferably contains a substance having an electron mobility of $10^{-6}$ $cm^2/V \cdot s$ or greater because the driving voltage of the light-emitting element can be reduced.

As the substance having a high electron-transport property, a metal complex having a quinoline skeleton or a benzoquinoline skeleton (e.g., tris(8-quinolinolato)aluminum (abbreviation: Alq)), a metal complex having an oxazole-based or thiazole-based ligand (e.g., bis[2-(2-hydroxyphenyl)benzoxazolato]zinc (abbreviation: $Zn(BOX)_2$)), or another compound (e.g., bathophenanthroline (abbreviation: BPhen)) can be used. Further, a high molecular compound (e.g., poly[(9,9-dihexylfluorene-2,7-diyl)-co-(pyridine-3,5-diyl)] (abbreviation: PF-Py)) can be used.

⟨Electron-Injection Layer⟩

The electron-injection layer is a layer containing a high electron-injection substance. The electron-injection layer is not limited to a single layer, but may be a stack of two or more layers containing substances having a high electron-injection property. The electron-injection layer is preferably provided because the efficiency of electron injection from the cathode 1102 can be increased and the driving voltage of the light-emitting element can be reduced.

As the substance having a high electron-injection property, an alkali metal (e.g., lithium (Li), or cesium (Cs)), an alkaline earth metal (e.g., calcium (Ca)), a compound of such a metal (e.g., oxide (specifically, lithium oxide, or the like), a carbonate (specifically, lithium carbonate, cesium carbonate, or the like), a halide (specifically, lithium fluoride (LiF), cesium fluoride (CsF), or calcium fluoride ($CaF_2$)), or the like can be given.

Alternatively, the layer containing a high electron-injection property may be a layer containing a substance with a high electron-transport property and a donor substance (specifically, a layer made of Alq containing magnesium (Mg)). Note that the donor substance is preferably added so that the mass ratio of the donor substance to the substance with a high electron-transport property is from 0.001:1 to 0.1:1.

As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal.

⟨Material for Charge Generation Region⟩

The first charge generation region 1104c and the second charge generation region are regions containing a substance having a high hole-transport property and an acceptor substance. The charge generation region may not only include a high hole-transport substance and an acceptor substance in the same film but also includes a stacked layer of a layer containing a high hole-transport substance and a layer containing an acceptor substance. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing the acceptor substance is in contact with the anode 1101.

Note that the acceptor substance is preferably added to the charge generation region so that the mass ratio of the acceptor substance to the substance having a high hole-transport property is from 0.1:1 to 4.0:1

As the acceptor substance that is used for the charge generation region, a transition metal oxide and an oxide of a metal belonging to Group 4 to 8 of the periodic table can be given. Specifically, molybdenum oxide is particularly preferable. Note that molybdenum oxide has a low hygroscopic property.

As the high hole-transport substance used for the charge production region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ $cm^2$/Vs or greater is preferably used. However, other substances than the above described materials may also be used as long as the substances have greater hole-transport properties than electron-transport properties.

⟨Material for Electron-Relay Layer⟩

The electron-relay layer 1104b is a layer that can immediately receive electrons drawn out by the acceptor substance in the first charge generation region 1104c. Therefore, the electron-relay layer 1104b is a layer containing a substance having a high electron-transport property, and the LUMO level of the electron-relay layer 1104b is positioned between the acceptor level of the acceptor substance in the first charge generation region 1104c and the LUMO level of the light-emitting unit 1103 with which the electron-relay layer is in contact. Specifically, the LUMO level of the electron-relay layer 105 is preferably about from −5.0 eV to −3.0 eV.

As the substance used for the electron-relay layer 1104b, a perylene derivative (e.g., 3,4,9,10-perylenetetracarboxylic dianhydride (abbreviation: PTCDA)), nitrogen-containing condensed aromatic compound (pirazino[2,3-f][1,10]phenanthroline-2,3-dicarbonitrile (abbreviation: PPDN)), or the like can be given.

Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used because such a compound further facilitates reception of electrons in the electron-relay layer 1104b.

⟨Material for Electron-Injection Buffer⟩

An electron-injection buffer is a layer including a substance having a high electron-injection property. The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

As the substance having a high electron-injection property, an alkali metal, an alkali earth metal, a rare earth metal, a compound of these metals, or the like can be given.

Further, the layer containing a substance having a high electron-injection property may be a layer containing a substance having a high electron-transport property and a donor substance.

⟨Method for Manufacturing Light-Emitting Element⟩

A method for manufacturing the light-emitting element will be described. Over the first electrode, the layers described above are combined as appropriate to form an EL layer. Any of a variety of methods (e.g., a dry process or a wet process) can be used for the EL layer depending on the material for the EL layer. For example, a vacuum evaporation method, a transfer method, a printing method, an inkjet method, a spin coating method, or the like may be selected. Note that a different formation method may be employed for each layer. In the above manner, the light-emitting element is manufactured.

The light-emitting element described in this embodiment can be fabricated by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. In order to obtain white light emission, for example, a structure may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting, light of blue, green, and red.

This embodiment can be freely combined with any of the other embodiments in this specification.

Embodiment 5

In this embodiment, examples of a light-emitting device including a light-emitting module in accordance with one embodiment of the present invention are described with reference to FIGS. 7A and 7B. Specifically, a light-emitting device (a lighting device or a lighting equipment) used for lighting will be described.

According to one embodiment of the present invention, a lighting device in which a light-emitting portion has a curved surface can be realized.

One embodiment of the present invention can also be applied to lighting in a car; for example, lighting can be easily mounted on a dashboard, a ceiling, or the like.

Figure 7A:
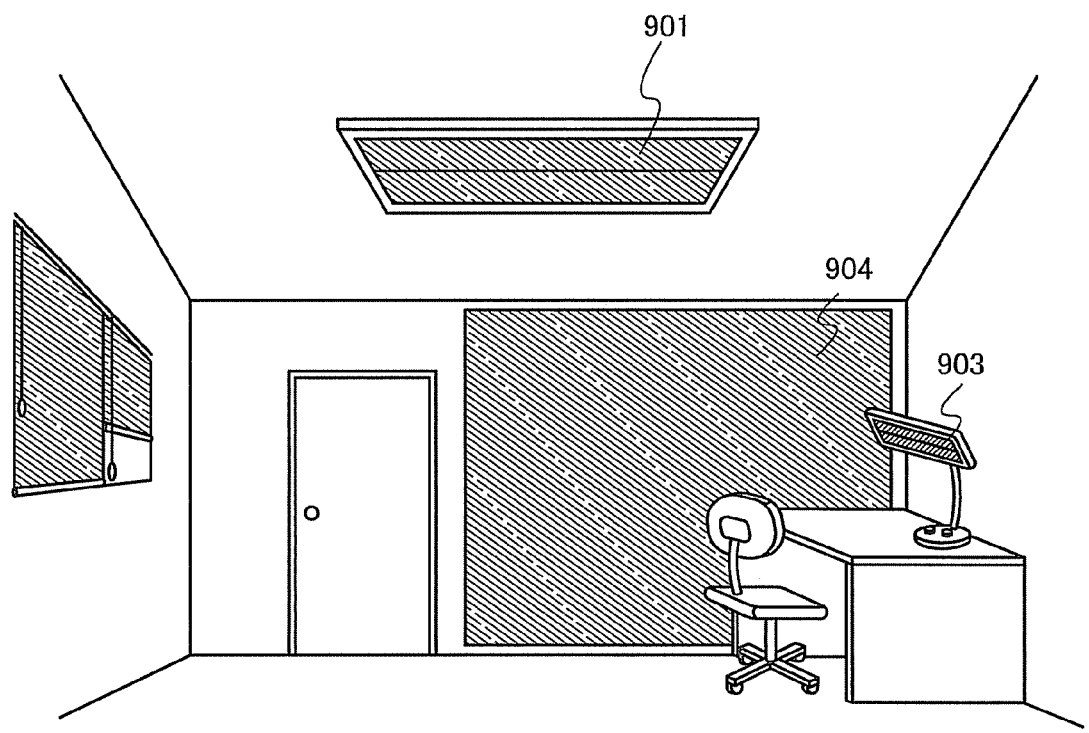
FIGS. 7A and 7B illustrate light-emitting devices each using a light-emitting module according to one embodiment.

In FIG. 7A, a lighting device 901 provided on the ceiling in a room, a lighting device 904 provided on a wall, and a desk lamp 903, to which one embodiment of the present invention is applied, are illustrated. Since the light-emitting device can be enlarged, the light emitting device can be used as a large-area illumination device.

Figure 7B:
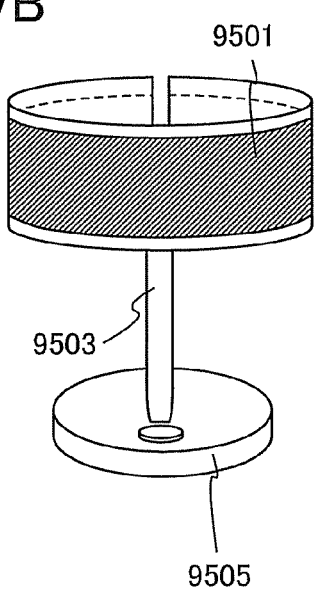

In FIG. 7B, an example of another lighting device is illustrated. A table lamp illustrated in FIG. 7B includes a lighting portion 9501, a support 9503, a support base 9505, and the like. The lighting portion 9501 includes the light-emitting module in accordance with one embodiment of the present invention. According to one embodiment of the present invention, a lighting device having a curved surface can be realized.

This application is based on Japanese Patent Application serial no. 2011-229901 filed with Japan Patent Office on Oct. 19, 2011, the entire contents of which are hereby incorporated by reference.

What is claimed is:

1. A light-emitting module comprising:
a substrate,
a first electrode over a first surface of the substrate;
a layer containing a light-emitting organic compound over the first electrode;
a second electrode over the layer containing the light-emitting organic compound; and
a diffuse reflection layer beneath a second surface of the substrate,
wherein the diffuse reflection layer is capable of reflecting light emitted from the layer containing the light-emitting organic compound,
wherein the diffuse reflection layer has a diffuse reflectance of greater than or equal to 75% and less than 100%, and
wherein difference between a refractive index of the layer containing the light-emitting organic compound and a refractive index of the substrate is 0.2 or less.

2. The light-emitting module according to claim 1,
wherein the substrate, the first electrode, and the second electrode each have a property of transmitting light.

3. The light-emitting module according to claim 1,
wherein the diffuse reflection layer comprises a base material and particles dispersed in the base material,
wherein the particles have a median particle diameter of greater than or equal to 1 μm and less than or equal to 100 μm, and
wherein the diffuse reflection layer has a transmittance of less than 25% of the light emitted from the layer containing the light-emitting organic compound.

4. The light-emitting module according to claim 1,
wherein the diffuse reflection layer comprises a base material and particles dispersed in the base material,
wherein a refractive index of the base material is different from a refractive index of the substrate by 0.2 or less, or higher than the refractive index of the substrate, and
wherein difference between a refractive index of the particles and the refractive index of the base material is 0.3 or more.

5. The light-emitting module according to claim 1,
wherein the diffuse reflection layer comprises a base material and particles dispersed in the base material,
wherein a refractive index of the particles is different from a refractive index of the substrate by 0.2 or less, or higher than the refractive index of the substrate, and
wherein difference between the refractive index of the particles and a refractive index of the base material is 0.3 or more.

6. The light-emitting module according to claim 1, further comprising:
a connection layer between the second surface of the substrate and the diffuse reflection layer,
wherein a refractive index of the connection layer is different from a refractive index of the substrate by 0.2 or less.

7. The light-emitting module according to claim 1,
wherein the substrate has a gas barrier property.

8. A light-emitting module comprising:
a substrate,
a first electrode over a first surface of the substrate;
a first layer containing a light-emitting organic compound over the first electrode;
a second electrode over the first layer; and
a second layer comprising a base material and particles dispersed in the base material beneath a second surface of the substrate,
wherein the second layer is capable of reflecting light emitted from the first layer,
wherein the particles have a median particle diameter of greater than or equal to 1 μm and less than or equal to 100 μm, and
wherein the second layer has a transmittance of less than 25% of the light emitted from the layer containing the light-emitting organic compound.

9. The light-emitting module according to claim 8,
wherein the second layer has a diffuse reflectance of greater than or equal to 75% and less than 100%.

10. The light-emitting module according to claim 8,
wherein the substrate, the first electrode, and the second electrode each have a property of transmitting light.

11. The light-emitting module according to claim 8,
wherein difference between a refractive index of the first layer and a refractive index of the substrate is 0.2 or less.

12. The light-emitting module according to claim 8,
wherein a refractive index of the base material is different from a refractive index of the substrate by 0.2 or less, or higher than the refractive index of the substrate, and
wherein difference between a refractive index of the particles and the refractive index of the base material is 0.3 or more.

13. The light-emitting module according to claim 8,
wherein a refractive index of the particles is different from a refractive index of the substrate by 0.2 or less, or higher than the refractive index of the substrate, and
wherein difference between the refractive index of the particles and a refractive index of the base material is 0.3 or more.

14. The light-emitting module according to claim 8, further comprising:
   a connection layer between the second surface of the substrate and the second layer,
   wherein a refractive index of the connection layer is different from are fractive index of the substrate by 0.2 or less.

15. The light-emitting module according to claim 8, wherein the substrate has a gas barrier property.

* * * * *